(12) United States Patent
Maruyama et al.

(10) Patent No.: US 7,446,456 B2
(45) Date of Patent: Nov. 4, 2008

(54) PIEZOELECTRIC COMPOSITE DEVICE, METHOD OF MANUFACTURING SAME, METHOD OF CONTROLLING SAME, INPUT-OUTPUT DEVICE, AND ELECTRONIC DEVICE

(75) Inventors: Shigeaki Maruyama, Kanagawa (JP); Junichi Sekine, Kanagawa (JP); Ivan Poupyrev, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/567,807

(22) Filed: Dec. 7, 2006

(65) Prior Publication Data
US 2007/0096594 A1 May 3, 2007

Related U.S. Application Data

(62) Division of application No. 11/193,238, filed on Jul. 29, 2005.

(30) Foreign Application Priority Data
Aug. 3, 2004 (JP) ............................ P2004-227053

(51) Int. Cl.
  H01L 41/09 (2006.01)
  H01L 41/113 (2006.01)
  H01L 41/083 (2006.01)
(52) U.S. Cl. .................... 310/328; 310/317; 310/338
(58) Field of Classification Search ............... 310/338, 310/316.01, 317, 318, 330–332, 328
See application file for complete search history.

(56) References Cited

U.S. PATENT DOCUMENTS

| 3,233,466 | A | 2/1966 | Shaw, Jr. |
| 4,546,658 | A | 10/1985 | Rocha et al. |
| 6,229,247 | B1 | 5/2001 | Bishop |
| 6,720,712 | B2 | 4/2004 | Scott et al. |
| 7,113,177 | B2 * | 9/2006 | Franzen ............... 345/173 |
| 2003/0102774 | A1 * | 6/2003 | Carazo et al. ........... 310/317 |

FOREIGN PATENT DOCUMENTS

| JP | 06-043998 | 2/1994 |
| JP | 2001-202195 | 7/2001 |
| JP | 2003-173724 | 6/2003 |
| JP | 2004-094389 | 3/2004 |

* cited by examiner

Primary Examiner—J. SanMartin
Assistant Examiner—Derek J Rosenau
(74) Attorney, Agent, or Firm—Sonnenschein Nath & Rosenthal LLP

(57) ABSTRACT

A piezoelectric composite device including: a feeding electrode; a common electrode; a signal detecting electrode; a first piezoelectric element joined between the feeding electrode and the common electrode; and a second piezoelectric element joined between the common electrode and the signal detecting electrode; a predetermined voltage being supplied between the feeding electrode and the common electrode; and a force detection signal based on an external force being extracted from the detecting electrode.

5 Claims, 26 Drawing Sheets

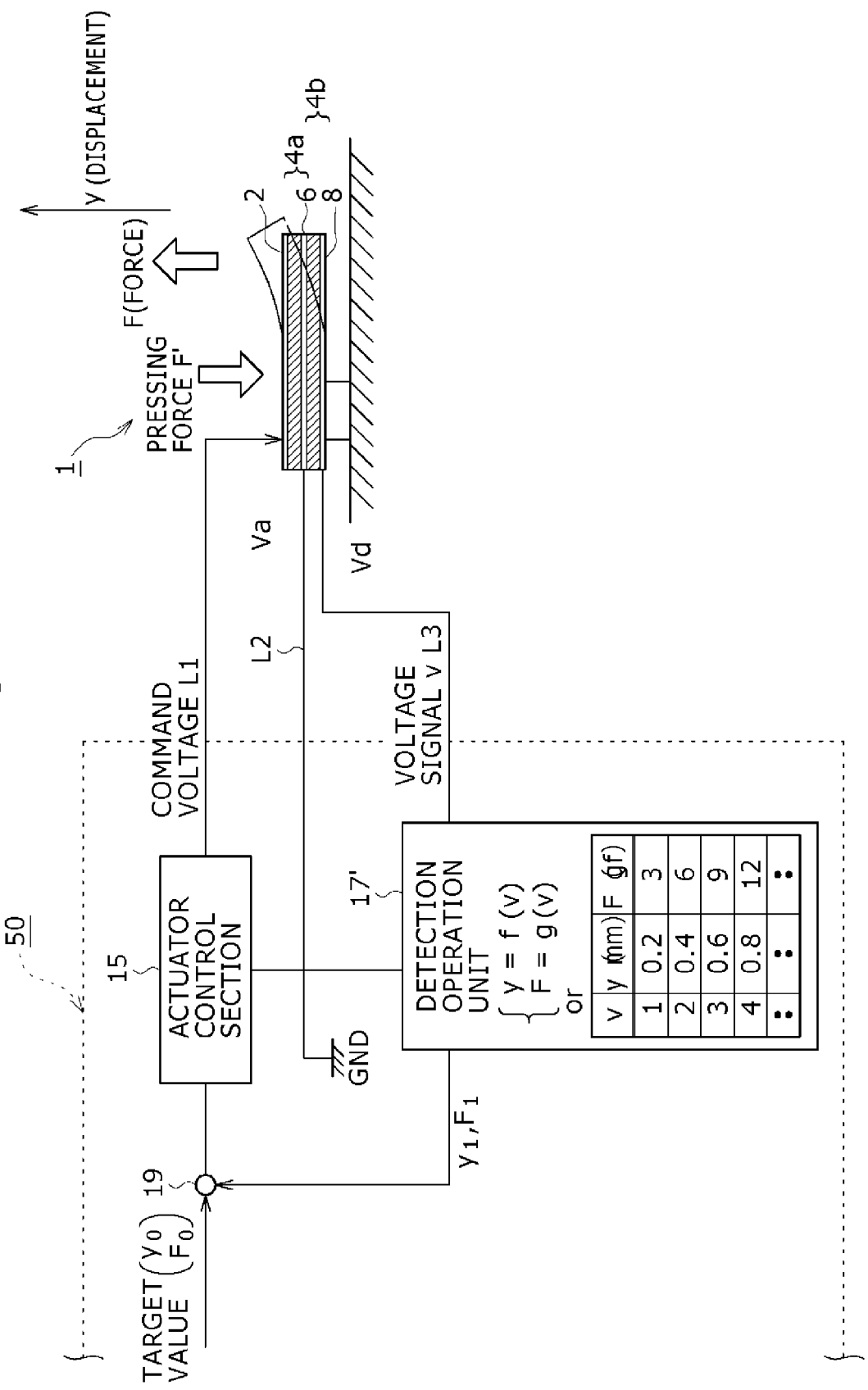

← DETECTION VOLTAGE Vd

FIG.14A
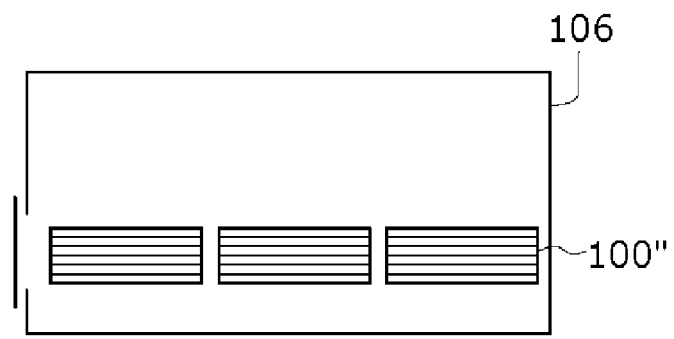
FIG.14B
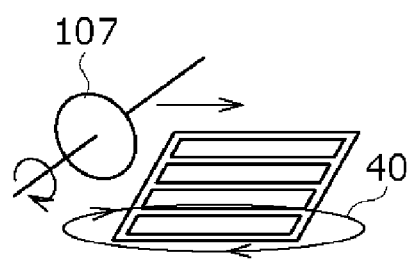
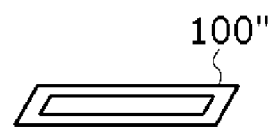
FIG.14C
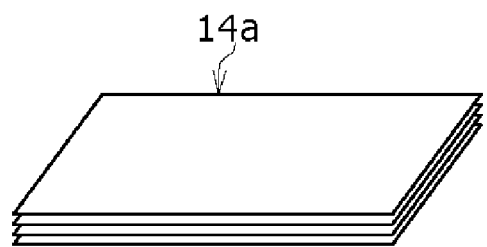

 ELECTRODE
 THROUGH HOLE

US 7,446,456 B2

PIEZOELECTRIC COMPOSITE DEVICE, METHOD OF MANUFACTURING SAME, METHOD OF CONTROLLING SAME, INPUT-OUTPUT DEVICE, AND ELECTRONIC DEVICE

RELATED APPLICATION DATA

This application is a divisional of U.S. patent application Ser. No. 11/193,238, filed Jul. 29, 2005, the entirety of which is incorporated herein by reference to the extent permitted by law. The present application claims priority to Japanese patent application No. 2004-227053 filed in the Japanese Patent Office on Aug. 3, 2004, the entirety of which also is incorporated by reference herein to the extent permitted by law.

BACKGROUND OF THE INVENTION

The present invention relates to a piezoelectric composite device, a method of manufacturing the same, a method of controlling the same, an input-output device, and an electronic device that are suitable for application to portable telephones, digital cameras, portable terminals, remote controllers and the like having a tactile input function.

The present invention relates particularly to a piezoelectric composite device including a first piezoelectric element joined between a feeding electrode and a common electrode; and a second piezoelectric element joined between the common electrode and a signal detecting electrode; wherein a predetermined voltage is supplied between the feeding electrode and the common electrode, and a force detection signal based on an external force is extracted from the detecting electrode, so that the piezoelectric composite device can be provided which combines a piezoelectric bimorph type actuator vibrating on the basis of the predetermined voltage supplied between the feeding electrode and the common electrode with a force detecting sensor outputting the force detection signal based on the external force.

There have recently been more and more cases where users (operators) use a digital camera having multiple operation modes to photograph a subject, and capture various contents into a portable terminal such as a portable telephone, a PDA (Personal Digital Assistant) or the like and use the various contents. The digital camera and the portable terminal and the like have an input-output device. A touch panel that combines input section such as a keyboard, various keys, a JOG dial and the like with a display unit, for example, is often used for the input-output device.

In addition, an input-output device combined with an actuator has been developed. In the actuator, piezoelectric elements having different amounts of distortion in two or more layers, or piezoelectric elements and a non-piezoelectric element are bonded to each other, and a bend deformation of the bonded object which deformation is caused by a difference in the amounts of distortion of both the elements when a voltage is applied to the piezoelectric elements is used dynamically. So-called bimorph actuators, unimorph actuators, disk actuators and the like (hereinafter referred to collectively as piezoelectric bimorph type actuators) are often used as the actuator.

FIG. 26 is a perspective view of an example of structure of a multilayer piezoelectric bimorph type actuator 300 according to a conventional example. The multilayer piezoelectric bimorph type actuator 300 shown in FIG. 26 is formed by bonding together laminated piezoelectric substance groups 4a and 4b that elongate and contract respectively in opposite directions to each other on both sides of a central electrode 13 as a neutral surface of bend deformation. A metal sheet of stainless steel or the like is generally used for the central electrode 13. Leads L1 and L2 are connected to the central electrode 13 and an upper part surface electrode 11 or a lower part surface electrode 12. The upper part surface electrode 11 and the lower part surface electrode 12 are used in a state of being short-circuited by a short-circuit line L0. The actuator 300 is characterized by allowing lower-voltage driving as compared with a single-layer piezoelectric actuator.

FIG. 27 is a sectional view showing an example of a laminated structure of the multilayer piezoelectric bimorph type actuator 300. FIG. 27 is a sectional view taken along a line Y1-Y2 of FIG. 26 showing the actuator 300. The multilayer piezoelectric bimorph type actuator 300 shown in FIG. 27 has the laminated piezoelectric substance group 4a and the laminated piezoelectric substance group 4b. Piezoelectric elements within the same laminated piezoelectric substance group 4a deform in the same direction, and piezoelectric elements within the same laminated piezoelectric substance group 4b deform in the same direction. The laminated piezoelectric substance group 4a and the laminated piezoelectric substance group 4b deform in opposite directions to each other. The actuator 300 thereby performs bend deformation. In order to drive the actuator 300, power is supplied with the surface electrodes (upper and lower) 11 and 12 at outermost surfaces short-circuited and with the leads L1 and L2 connected to the upper part surface electrode 11 or the lower part surface electrode 12 and the central electrode 13, as shown in FIG. 26.

The actuator 300 can be used as a force detecting sensor as reverse action of the actuator 300. In this case, a voltage generated by a deformation of the actuator 300 due to an external force is taken out from the above-mentioned leads L1 and L2 to the outside. Each of the laminated piezoelectric substance groups 4a and 4b includes piezoelectric elements in the form of layers and internal electrode layers (main electrodes) IE1 to IE16 formed such that the piezoelectric elements are sandwiched between the internal electrode layers IE1 to IE16. These internal electrode layers IE1 to IE16 are connected within the actuator. Generally, in this internal connection, alternate layers are connected to each other by a method using via holes or an actuator side part formed with the internal electrodes exposed, for example, and the piezoelectric elements are used in electrically parallel connection with each other. The internal connection cannot be changed from the outside. This is because the internal connection is not drawn out to the outside of the actuator.

In relation to an electronic device having this kind of piezoelectric actuator, for example, in Japanese Patent Laid-Open No. 2004-94389 (pages 4 and 5, FIG. 11) (hereinafter referred to as Patent Document 1), discloses an input-output device and an electronic device. This electronic device includes an input-output device having a multilayer piezoelectric bimorph type actuator and a touch panel. The multilayer piezoelectric bimorph type actuator feeds back a different tactile sense to a user through the touch panel according to a type of information. The electronic device being thus formed, when the user performs an input operation on the touch panel using the sense of touch, a tactile feedback in response to the input operation in accordance with a type of information can be surely provided to the user.

SUMMARY OF THE INVENTION

The input-output device using the multilayer piezoelectric bimorph type actuator 300 according to the conventional example has the following problems.

i. When the multilayer piezoelectric bimorph type actuator 300 is used as a force detecting sensor, the force detecting sensor needs to be formed by a discrete structure separate from and independent of a structure in which the multilayer piezoelectric bimorph type actuator 300 is used as an actuator. Hence, the two structures of the force detecting sensor and the actuator need to be attached to the input-output device, thus requiring more mounting space as compared with a case where the structures are integrated into one structure.

ii. When an electronic device having an input-output device as disclosed in Patent Document 1 provides a tactile sense to a user and detects the pressing force of the user or the like at the same time, and the multilayer piezoelectric bimorph type actuator 300 is to be applied, it is desirable that the function of a force detecting sensor and the function of an actuator be used simultaneously. However, a difficulty is involved in integrating the two structures described above into one structure. It is therefore difficult to realize the two functions by one structure when the structure of the multilayer piezoelectric bimorph type actuator 300 in the conventional form is used as it is.

iii. Incidentally, when the function of a force detecting sensor and the function of an actuator are to be used simultaneously with the structure of the multilayer piezoelectric bimorph type actuator 300 in the conventional form used as it is, a command voltage for driving the actuator is included in a voltage detected by the force detecting sensor. As compared with this driving command voltage, the voltage (sensor output signal) varied by external force is low, so that the separation of the voltages is technically difficult. In addition to this, the addition of a complex circuit is expected, which will be disadvantageous from a viewpoint of size and cost of the actuator.

Accordingly, the present invention solves the above-described problems, and it is desirable to provide a piezoelectric composite device, a method of manufacturing the same, a method of handling the same, a method of controlling the same, an input-output device, and an electronic device that enable a laminate in which one or more lead electrodes and piezoelectric elements are laminated to function both as an actuator and as a force detecting sensor.

According to an embodiment of the present invention, there is provided a piezoelectric composite device including: a feeding electrode; a common electrode; a signal detecting electrode; a first piezoelectric element joined between the feeding electrode and the common electrode; and a second piezoelectric element joined between the common electrode and the signal detecting electrode; a predetermined voltage being supplied between the feeding electrode and the common electrode; and a force detection signal based on an external force being extracted from the detecting electrode.

The first piezoelectric composite device according to the embodiment of the present invention includes the first piezoelectric element joined between the feeding electrode and the common electrode, and the second piezoelectric element joined between the common electrode and the signal detecting electrode. With this laminated structure as a precondition, a predetermined voltage is supplied between the feeding electrode and the common electrode, and a force detection signal based on an external force is extracted from the detecting electrode.

It is thus possible to provide the piezoelectric composite device which combines a piezoelectric bimorph type actuator vibrating on the basis of the predetermined voltage supplied between the feeding electrode and the common electrode, and a force detecting sensor outputting the force detection signal based on the external force.

According to an embodiment of the present invention, there is provided a first method of manufacturing a piezoelectric composite device, the method including: a step of joining a first piezoelectric element between a feeding electrode and a common electrode; a step of joining a second piezoelectric element between the common electrode and a signal detecting electrode; a step of connecting leads for supplying a predetermined voltage to each of the feeding electrode and the common electrode; and a step of connecting leads for extracting a force detection signal based on an external force to each of the common electrode and the signal detecting electrode.

According to the first method of manufacturing a piezoelectric composite device according to the embodiment of the present invention, it is possible to manufacture the piezoelectric composite device which combines a piezoelectric bimorph type actuator vibrating on the basis of the predetermined voltage supplied between the feeding electrode and the common electrode, and a force detecting sensor outputting the force detection signal based on the external force.

According to an embodiment of the present invention, there is provided a first method of controlling a piezoelectric composite device, the piezoelectric composite device including a feeding electrode, a common electrode, a signal detecting electrode, a first piezoelectric element joined between the feeding electrode and the common electrode, and a second piezoelectric element joined between the common electrode and the signal detecting electrode, wherein a control device connected to each of the feeding electrode, the common electrode, and the signal detecting electrode is provided, and the control device supplies power between the feeding electrode and the common electrode according to a preset control signal and detects a force detection signal from the signal detecting electrode.

According to the first method of controlling a piezoelectric composite device according to the embodiment of the present invention, the control device is connected to each of the feeding electrode, the common electrode, and the signal detecting electrode. The control device supplies power between the feeding electrode and the common electrode according to a preset control signal and detects a force detection signal from the signal detecting electrode.

Thus, an actuator function can be performed by the first piezoelectric element joined between the feeding electrode and the common electrode, and a force detecting function can be performed by the second piezoelectric element joined between the common electrode and the signal detecting electrode. In addition, when power is supplied to each of the feeding electrode, the common electrode, and the signal detecting electrode, an actuator function can be performed by the first piezoelectric element and the second piezoelectric element. It is therefore possible to perform function switching control in which the second piezoelectric element made to perform the force detecting function is made to function as an actuator according to circumstances.

According to an embodiment of the present invention, there is provided a first input-output device including: input section for detecting a contact position of an operating object and outputting input information; and tactile sense providing and information determining section for providing a tactile sense to the operating object operating the input section, and detecting a force at the contact position of the operating object and determining the input information; the tactile sense providing and information determining section having a piezoelectric composite device; the piezoelectric composite device including a feeding electrode, a common electrode, a signal detecting electrode, a first piezoelectric element joined between the feeding electrode and the common electrode, and a second piezoelectric element joined between the common electrode and the signal detecting electrode; a predetermined voltage being supplied between the feeding electrode and the common electrode; and a force detection signal based on an external force being extracted from the detecting electrode.

According to the first input-output device in accordance with the embodiment of the present invention, the first piezoelectric composite device according to an embodiment of the present invention is applied to the tactile sense providing and information determining section. The first piezoelectric composite device includes a feeding electrode, a common electrode, a signal detecting electrode, a first piezoelectric element joined between the feeding electrode and the common electrode, and a second piezoelectric element joined between the common electrode and the signal detecting electrode. With this as a precondition, the input section detects a contact position of an operating object and outputs input information. The tactile sense providing and information determining section provides a tactile sense to the operating object operating the input section, and detects a force at the contact position of the operating object and determines the input information.

Hence, since a part of the piezoelectric composite device functioning as a piezoelectric bimorph type actuator can be used as a force detecting sensor for determining the information, the function of the actuator and the function of the force detecting sensor can be used at the same time. In addition, as compared with a case where the actuator and the force detecting sensor are provided separately from each other, a mounting space is shared and thus the input-output device can be made more compact.

According to an embodiment of the present invention, there is provided a first electronic device including an input-output device; the input-output device including input section for detecting a contact position of an operating object and outputting input information, and tactile sense providing and information determining section for providing a tactile sense to the operating object operating the input section, and detecting a force at the contact position of the operating object and determining the input information; the tactile sense providing and information determining section of the input-output device having a piezoelectric composite device; the piezoelectric composite device including a feeding electrode, a common electrode, a signal detecting electrode, a first piezoelectric element joined between the feeding electrode and the common electrode, and a second piezoelectric element joined between the common electrode and the signal detecting electrode; a predetermined voltage being supplied between the feeding electrode and the common electrode; and a force detection signal based on an external force being extracted from the detecting electrode.

According to the first electronic device in accordance with the embodiment of the present invention, the first piezoelectric composite device according to an embodiment of the present invention is applied to the tactile sense providing and information determining section of the first input-output device. The first piezoelectric composite device includes a feeding electrode, a common electrode, a signal detecting electrode, a first piezoelectric element joined between the feeding electrode and the common electrode, and a second piezoelectric element joined between the common electrode and the signal detecting electrode. With this as a precondition, the input section detects a contact position of an operating object and outputs input information. The tactile sense providing and information determining section provides a tactile sense to the operating object operating the input section, and detects a force at the contact position of the operating object and determines the input information.

Hence, since a part of the first piezoelectric composite device functioning as a piezoelectric bimorph type actuator can be used as a force detecting sensor, the function of the actuator and the function of the force detecting sensor can be used at the same time. In addition, as compared with a case where the actuator and the force detecting sensor are provided separately from each other, a mounting space is shared and thus the electronic device can be made more compact.

According to an embodiment of the present invention, there is provided a second piezoelectric composite device including: a first laminate and a second laminate formed by laminating a lead electrode and one or more piezoelectric elements; and a third laminate having another lead electrode, and having one or more piezoelectric elements laminated between the first laminate and the second laminate.

According to the second piezoelectric composite device in accordance with the embodiment of the present invention, when power is supplied to the lead electrodes of the first laminate and the second laminate, the one or more piezoelectric elements can be vibrated, so that the piezoelectric composite device can be made to function as a piezoelectric bimorph type actuator. In addition, when a force is applied to the third laminate, a force detection signal can be output from the lead electrode of the third laminate, so that the piezoelectric composite device can be made to function as a force detecting sensor. Further, a composite function combining the above-described functions can be realized. It is thereby possible to provide a multifunction actuator of a low voltage driving type or the like that enables both the functions to be used simultaneously.

According to an embodiment of the present invention, there is provided a second method of manufacturing a piezoelectric composite device, the method including: a step of forming a laminate by one or more piezoelectric elements and lead electrodes; a step of electrically dividing the laminate to demarcate at least three laminates; a step of drawing out electrodes from a piezoelectric element situated in a central laminate of the demarcated laminates; and a step of drawing out electrodes from piezoelectric elements of the other laminates situated on both sides of the central laminate.

According to the second method of manufacturing a piezoelectric composite device in accordance with the embodiment of the present invention, a piezoelectric bimorph type actuator and a force detecting sensor can be formed within an identical structure. It is thereby possible to manufacture a multifunction actuator of a low voltage driving type or the like that enables both the function of the actuator and the function of the force detecting sensor to be used simultaneously. In addition, as compared with a case where the actuator and the force detecting sensor are provided separately from each other, a mounting space is shared and thus the electronic device can be made more compact.

According to an embodiment of the present invention, there is provided a second method of controlling a piezoelectric composite device, the piezoelectric composite device including a first laminate and a second laminate formed by laminating a lead electrode and one or more piezoelectric elements, and a third laminate having another lead electrode, and having one or more piezoelectric elements laminated between the first laminate and the second laminate, wherein a control device connected to the lead electrode of each of the first laminate, the second laminate, and the third laminate is provided, and the control device supplies power to the lead electrode of each of the first laminate and the second laminate according to a preset control signal, and supplies power to the lead electrode of the third laminate or detects a force detection signal from the lead electrode of the third laminate.

According to the second method of controlling a piezoelectric composite device according to the embodiment of the present invention, the control device is connected to the lead electrode of each of the first laminate, the second laminate, and the third laminate formed by laminating a lead electrode and one or more piezoelectric elements. The control device supplies power to the lead electrode of each of the first laminate and the second laminate according to a preset control signal, and detects a force detection signal from the lead electrode of the third laminate.

Thus, an actuator function can be performed by the first laminate and the second laminate, and a force detecting function can be performed by the third laminate. In addition, when power is supplied to the lead electrode of each of the first laminate, the second laminate, and the third laminate, an actuator function can be performed by the first laminate, the second laminate, and the third laminate. It is therefore possible to perform function switching control in which the piezoelectric element or the piezoelectric elements of the third laminate made to perform the force detecting function is or are made to function as an actuator according to circumstances.

According to an embodiment of the present invention, there is provided a second input-output device including: input section for detecting a contact position of an operating object and outputting input information; and tactile sense providing and information determining section for providing a tactile sense to the operating object operating the input section, and detecting a force at the contact position of the operating object and determining the input information; the tactile sense providing and information determining section having a piezoelectric composite device; the piezoelectric composite device including a first laminate and a second laminate formed by laminating a lead electrode and one or more piezoelectric elements, and a third laminate having another lead electrode and having one or more piezoelectric elements laminated between the first laminate and the second laminate.

According to the second input-output device in accordance with the embodiment of the present invention, the piezoelectric composite device according to an embodiment of the present invention is applied to the tactile sense providing and information determining section. The piezoelectric composite device includes a first laminate and a second laminate formed by laminating a lead electrode and one or more piezoelectric elements, and a third laminate having another lead electrode and having one or more piezoelectric elements laminated between the first laminate and the second laminate. With this as a precondition, the input section detects a contact position of an operating object and outputs input information. The tactile sense providing and information determining section provides a tactile sense to the operating object operating the input section, and detects a force at the contact position of the operating object and determines the input information.

Hence, since a part of the piezoelectric composite device functioning as a piezoelectric bimorph type actuator can be used as a force detecting sensor for determining the information, the function of the actuator and the function of the force detecting sensor can be used at the same time. In addition, as compared with a case where the actuator and the force detecting sensor are provided separately from each other, a mounting space is shared and thus the input-output device can be made more compact.

According to an embodiment of the present invention, there is provided a second electronic device including an input-output device; the input-output device including input section for detecting a contact position of an operating object and outputting input information, and tactile sense providing and information determining section for providing a tactile sense to the operating object operating the input section, and detecting a force at the contact position of the operating object and determining the input information; the tactile sense providing and information determining section of the input-output device having a piezoelectric composite device; the piezoelectric composite device including a first laminate and a second laminate formed by laminating a lead electrode and one or more piezoelectric elements, and a third laminate having another lead electrode and having one or more piezoelectric elements laminated between the first laminate and the second laminate.

According to the second electronic device in accordance with the embodiment of the present invention, the second piezoelectric composite device according to an embodiment of the present invention is applied to the tactile sense providing and information determining section of the input-output device. The piezoelectric composite device includes a first laminate and a second laminate formed by laminating a lead electrode and one or more piezoelectric elements, and a third laminate having another lead electrode and having one or more piezoelectric elements laminated between the first laminate and the second laminate. With this as a precondition, the input section detects a contact position of an operating object and outputs input information. The tactile sense providing and information determining section provides a tactile sense to the operating object operating the input section, and detects a force at the contact position of the operating object and determines the input information.

Hence, since a part of the piezoelectric composite device functioning as a piezoelectric bimorph type actuator can be used as a force detecting sensor, the function of the actuator and the function of the force detecting sensor can be used at the same time. In addition, as compared with a case where the actuator and the force detecting sensor are provided separately from each other, a mounting space is shared and thus the electronic device can be made more compact.

The first piezoelectric composite device according to an embodiment of the present invention includes: a first piezoelectric element joined between a feeding electrode and a common electrode; and a second piezoelectric element joined between the common electrode and a signal detecting electrode; a predetermined voltage being supplied between the feeding electrode and the common electrode; and a force detection signal based on an external force being extracted from the detecting electrode.

With this constitution, it is possible to provide the piezoelectric composite device which combines a piezoelectric bimorph type actuator vibrating on the basis of the predetermined voltage supplied between the feeding electrode and the common electrode, and a force detecting sensor outputting the force detection signal based on the external force. Thus, when only the force detection signal based on the external force modulated by the predetermined voltage supplied between the feeding electrode and the common electrode can be extracted, it is possible to provide a multifunction actuator of a low voltage driving type or the like that enables the function of the actuator and the function of the force detecting sensor to be used simultaneously.

The first method of manufacturing a piezoelectric composite device according to an embodiment of the present invention includes: joining a first piezoelectric element between a feeding electrode and a common electrode; then joining a second piezoelectric element between the common electrode and a signal detecting electrode; then connecting leads for supplying a predetermined voltage to each of the feeding electrode and the common electrode; and then connecting leads for extracting a force detection signal based on an external force to each of the common electrode and the signal detecting electrode.

With this constitution, it is possible to manufacture the piezoelectric composite device which combines a piezoelectric bimorph type actuator vibrating on the basis of the predetermined voltage supplied between the feeding electrode and the common electrode, and a force detecting sensor outputting the force detection signal based on the external force. Thus, when only the force detection signal based on the external force modulated by the predetermined voltage supplied between the feeding electrode and the common electrode can be extracted, it is possible to manufacture a multifunction actuator of a low voltage driving type or the like that enables the function of the actuator and the function of the force detecting sensor to be used simultaneously.

In the first method of controlling a piezoelectric composite device, a control device connected to each of a feeding electrode, a common electrode, and a signal detecting electrode is provided, and the control device supplies power between the feeding electrode and the common electrode according to a preset control signal and detects a force detection signal from the signal detecting electrode.

With this constitution, it is possible to perform function switching control in which the second piezoelectric element joined between the common electrode and the signal detecting electrode and made to perform a force detecting function is made to function as an actuator according to circumstances.

According to the first input-output device in accordance with an embodiment of the present invention, the first piezoelectric composite device according to an embodiment of the present invention is applied. Therefore a part of the piezoelectric composite device functioning as a piezoelectric bimorph type actuator can be used as a force detecting sensor. Thus, the function of the actuator and the function of the force detecting sensor can be used at the same time. In addition, as compared with a case where the actuator and the force detecting sensor are provided separately from each other, a mounting space is shared and thus the input-output device can be made more compact.

According to the first electronic device in accordance with an embodiment of the present invention, the first input-output device according to an embodiment of the present invention is applied. Therefore a part of the piezoelectric composite device functioning as a piezoelectric bimorph type actuator can be used as a force detecting sensor. Thus, the function of the actuator and the function of the force detecting sensor can be used at the same time. In addition, as compared with a case where the actuator and the force detecting sensor are provided separately from each other, a mounting space is shared and thus the electronic device can be made more compact.

The second piezoelectric composite device according to an embodiment of the present invention includes: a first laminate and a second laminate formed by laminating a lead electrode and one or more piezoelectric elements; and a third laminate having another lead electrode, and having one or more piezoelectric elements laminated between the first laminate and the second laminate.

With this constitution, when power is supplied to the lead electrodes of the first laminate and the second laminate, the one or more piezoelectric elements can be vibrated, so that the piezoelectric composite device can be made to function as a piezoelectric bimorph type actuator. In addition, when a force is applied to the third laminate, a force detection signal can be output from the lead electrode of the third laminate, so that the piezoelectric composite device can be made to function as a force detecting sensor. Further, a composite function combining the above-described functions can be realized. It is thereby possible to provide a multifunction actuator of a low voltage driving type or the like that enables both the functions to be used simultaneously.

The second method of manufacturing a piezoelectric composite device according to an embodiment of the present invention includes: forming a laminate by one or more lead electrodes and piezoelectric elements; then electrically dividing the laminate to demarcate at least three laminates; drawing out electrodes from a piezoelectric element situated in a central laminate of the demarcated laminates; and further drawing out electrodes from piezoelectric elements of the other laminates situated on both sides of the central laminate.

With this constitution, a piezoelectric bimorph type actuator and a force detecting sensor can be formed within an identical structure. It is thereby possible to manufacture a multifunction actuator of a low voltage driving type or the like that enables both the function of the actuator and the function of the force detecting sensor to be used simultaneously. In addition, as compared with a case where the actuator and the force detecting sensor are provided separately from each other, a mounting space is shared and thus the electronic device can be made more compact.

In the second method of controlling a piezoelectric composite device according to an embodiment of the present invention, a control device connected to the lead electrode of each of a first laminate, a second laminate, and a third laminate formed by laminating a lead electrode and one or more piezoelectric elements is provided, and the control device supplies power to the lead electrode of each of the first laminate and the second laminate according to a preset control signal, and supplies power to the lead electrode of the third laminate or detects a force detection signal from the lead electrode of the third laminate.

With this constitution, it is possible to perform function switching control in which the piezoelectric element or the piezoelectric elements of the third laminate made to perform a force detecting function is or are made to function as an actuator according to circumstances.

According to the second input-output device in accordance with an embodiment of the present invention, the second piezoelectric composite device according to an embodiment of the present invention is applied. Therefore a part of the piezoelectric composite device functioning as a piezoelectric bimorph type actuator can be used as a force detecting sensor. Thus, the function of the actuator and the function of the force detecting sensor can be used at the same time. In addition, as compared with a case where the actuator and the force detecting sensor are provided separately from each other, a mounting space is shared and thus the input-output device can be made more compact.

According to the second electronic device in accordance with an embodiment of the present invention, the second input-output device according to an embodiment of the present invention is applied. Therefore a part of the piezoelectric composite device functioning as a piezoelectric bimorph type actuator can be used as a force detecting sensor. Thus, the function of the actuator and the function of the force detecting sensor can be used at the same time. In addition, as compared with a case where the actuator and the force detecting sensor are provided separately from each other, a mounting space is shared and thus the electronic device can be made more compact.

BRIEF DESCRIPTION OF THE DRAWINGS

FIG. 2 is a block diagram showing an example of feedback control of the multifunction piezoelectric actuator 1;

FIGS. 14A, 14B, and 14C are process diagrams representing an example (4) of manufacturing of the multifunction piezoelectric actuator;

DETAILED DESCRIPTION OF THE PREFERRED EMBODIMENTS

A piezoelectric composite device, a method of manufacturing the same, a method of handling the same, a method of controlling the same, an input-output device, and an electronic device according to embodiments of the present invention will hereinafter be described with reference to the drawings.

Figure 1A:
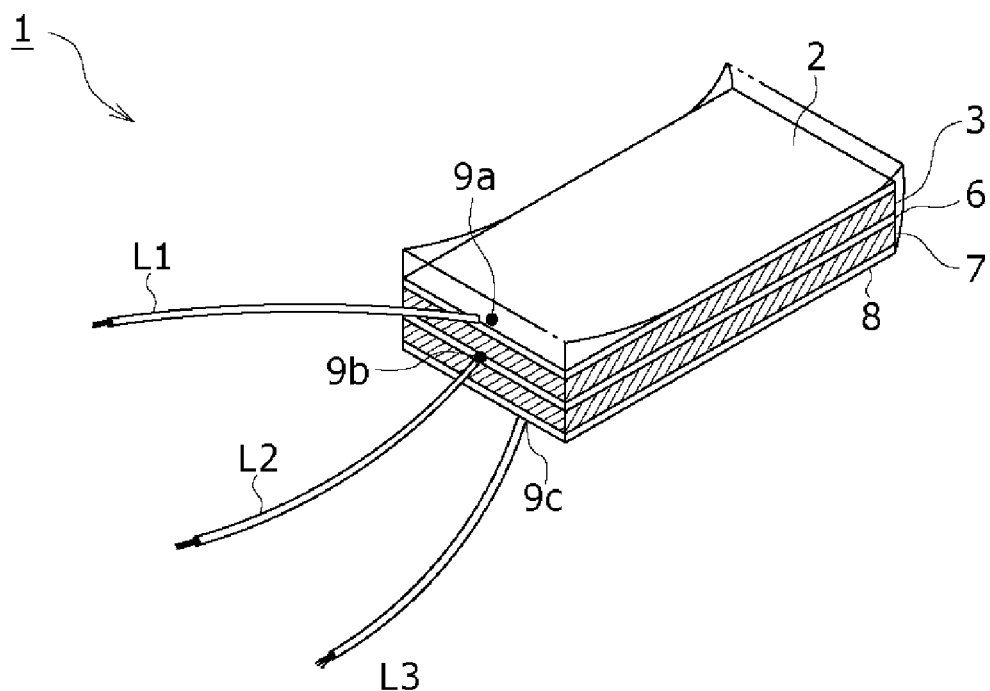
FIGS. 1A and 1B are a perspective view and a sectional view of an example of structure of a multifunction piezoelectric actuator 1 according to a first embodiment of the present invention.
Figure 1B:
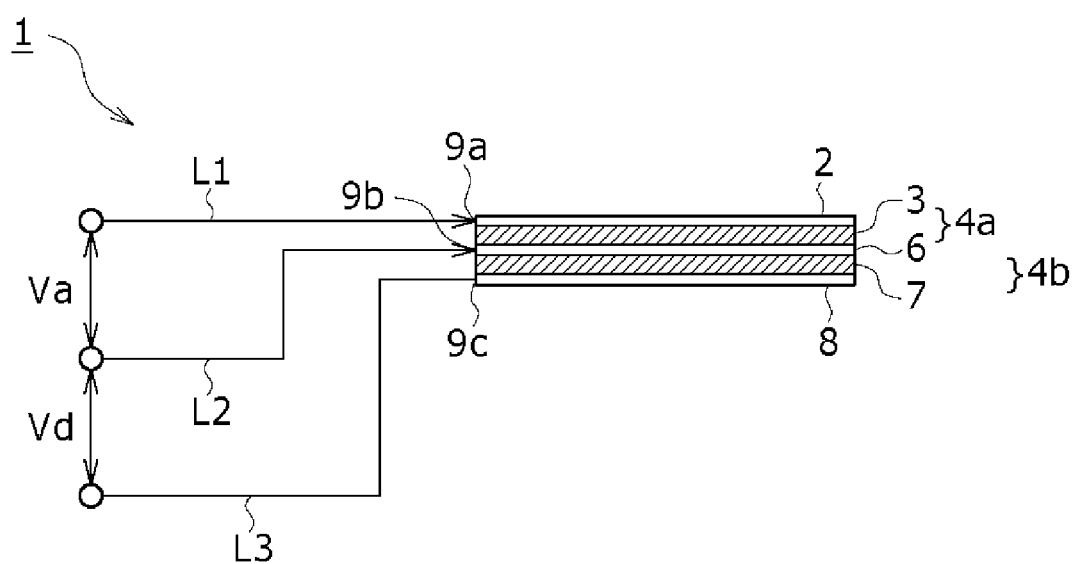

FIGS. 1A and 1B are a perspective view and a sectional view of an example of structure of a multifunction piezoelectric actuator 1 according to a first embodiment of the present invention.

The first embodiment includes: a first piezoelectric element joined between a feeding electrode and a common electrode; and a second piezoelectric element joined between the common electrode and a signal detecting electrode; wherein a predetermined voltage is supplied between the feeding electrode and the common electrode, and a force detection signal based on an external force is extracted from the detecting electrode. Thus a piezoelectric composite device can be provided which combines a piezoelectric bimorph type actuator vibrating on the basis of the predetermined voltage supplied between the feeding electrode and the common electrode, and a force detecting sensor outputting the force detection signal based on the external force.

The multifunction piezoelectric actuator 1 of a fixed connection type shown in FIG. 1A is an example of a piezoelectric composite device, and has the function of a piezoelectric actuator and the function of a force detecting sensor. As shown in FIG. 1B, the multifunction piezoelectric actuator 1 is formed by at least dividing (separating) one laminate electrically into two single-layer piezoelectric substances 4a and 4b. The multifunction piezoelectric actuator 1 has an electrode for feeding (hereinafter referred to as a feeding electrode) 2, a common electrode 6, and an electrode for signal detection (hereinafter referred to as a detecting electrode) 8. A first piezoelectric element 3 is joined between the feeding electrode 2 and the common electrode 6 to form one single-layer piezoelectric substance 4a. A predetermined voltage Va is supplied between the feeding electrode 2 and the common electrode 6 in the single-layer piezoelectric substance 4a so that the single-layer piezoelectric substance 4a functions as a piezoelectric actuator.

A second piezoelectric element 7 is joined between the common electrode 6 and the detecting electrode 8 to form another single-layer piezoelectric substance 4b. A force detection signal (hereinafter referred to also as a force detection voltage Vd) based on an external force is extracted from the detecting electrode 8. Thus the single-layer piezoelectric substance 4b functions as a force detecting sensor. The multifunction piezoelectric actuator 1 has three terminals 9a, 9b, and 9c. The first terminal 9a is connected to the feeding electrode 2. The terminal 9a is connected with a lead L1. The second terminal 9b is connected to the common electrode 6. The terminal 9b is connected with a lead L2. The third terminal 9c is connected to the detecting electrode 8. The terminal 9c is connected with a lead L3.

When the multifunction piezoelectric actuator 1 is formed as described above, actuator control section is connected to the lead L1 and the lead L2, and power is supplied to the first piezoelectric element 3 via the terminal 9a and the terminal 9b, the first piezoelectric element 3 vibrates. When an external force is applied to the second piezoelectric element 7, a detection voltage Vd is output to the lead L3. Thus, when only the force detection signal (detection voltage Vd) based on the external force modulated by the predetermined voltage Va supplied between the feeding electrode 2 and the common electrode 6 can be extracted, it is possible to provide for example a multifunction actuator of a low voltage driving type that enables both the functions to be used simultaneously.

FIG. 2 is a block diagram showing an example of feedback control of the multifunction piezoelectric actuator 1.

In this example, a control device 50 connected to each of the feeding electrode 2, the common electrode 6, and the detecting electrode 8 is provided. The control device 50 operates to supply power between the feeding electrode 2 and the common electrode 6 according to a preset control target value (y0, F0) and detect a force detection signal from the detecting electrode 8 (first control method).

The control device 50 shown in FIG. 2 has actuator control section 15, a detection operation unit 17', and a comparator 19. The control device 50 performs feedback control (servo control; closed loop actuator control) of the multifunction piezoelectric actuator 1 on the basis of the control target value (y0, F0) constituting one example of a control signal. The control target value y0 represents a displacement. The control target value F0 represents a force. The letter y denotes displacement by operation of the multifunction piezoelectric actuator 1. F denotes force generated by operation of the actuator. Generally, when the positioning of an object is controlled, the displacement y is selected as a controlled quantity, and when the force F exerted by the actuator on another object or the like is controlled, the force F is selected as a controlled quantity.

The actuator control section 15 in this example is connected with the feeding electrode 2 via the lead L1 shown in FIG. 1A. The actuator control section 15 determines a command voltage on the basis of the control target value y0 or F0 given to the actuator control section 15 in advance, and applies the command voltage to the single-layer piezoelectric substance 4a functioning as the actuator in the multifunction piezoelectric actuator 1.

A connection between the above-described detecting electrode 8 and the detection operation unit 17' is made by the lead L3 shown in FIG. 1A. The detection operation unit 17' is an example of detector. The detection operation unit 17' detects a pressing force F', and converts a detection voltage Vd output from the detecting electrode 8 into two control quantities. The detection operation unit 17' is provided in advance with functions y=f(v) and F=g(v) or a conversion table defining a relation between the detection voltage Vd (=v) and the displacement y or between the detection voltage Vd (=v) and the force F.

The conversion table stores for example the displacement y=0.2, 0.4, 0.6, 0.8 . . . [mm] and the force F=3, 6, 9, 12 . . . [gf] for voltage v=1, 2, 3, 4 . . . Let y1 or F1 be a control quantity after conversion. The comparator 19 is connected to the detection operation unit 17' to compare the control quantity y1 or F1 after conversion with the control target value (y0, F0). A result of the comparison is output to the actuator control section 15 to determine a new command voltage.

The detection voltage Vd occurring in the piezoelectric element 7 functioning as force detecting sensor as a result of the pressing force F' being applied to the actuator 1 in operation is output to the detection operation unit 17'. The detection voltage Vd is converted into a necessary control quantity y1 or F1 by the detection operation unit 17', and then compared with the target value (y0, F0) at the comparator 19. On the basis of a result of the comparison, the actuator control section 15 determines a new command voltage. The new command voltage is applied to the piezoelectric element 3 functioning as actuator in the multifunction piezoelectric actuator 1.

While the single-layer piezoelectric substance 4a and the single-layer piezoelectric substance 4b in the multifunction piezoelectric actuator 1 according to the first embodiment of the present invention are mechanically within an identical structure and close to each other, the single-layer piezoelectric substance 4a and the single-layer piezoelectric substance 4b are electrically independent of each other with the common electrode 6 as a boundary between the single-layer piezoelectric substance 4a and the single-layer piezoelectric substance 4b. In this respect, a part of the multifunction piezoelectric actuator 1 functioning as a piezoelectric bimorph type actuator can be used as a force detecting sensor. Therefore the function of the actuator and the function of the force detecting sensor can be used at the same time. In addition, as compared with a case where the actuator and the force detecting sensor are provided separately from each other, a mounting space is shared and thus an electronic device can be made more compact.

FIGS. 3A, 3B, and 3C and FIGS. 4A and 4B are process diagrams representing an example (1 and 2) of formation of the multifunction piezoelectric actuator 1.

In the first embodiment, a film-shaped piezoelectric substance 1' to be used as the piezoelectric element 3 and the piezoelectric element 7 shown in FIGS. 1A and 1B is formed. Thereafter an electrode pattern 2a to form the feeding electrode 2 and the detecting electrode 8 is formed on one surface of the film-shaped piezoelectric substance 1'. Further, the film-shaped piezoelectric substance 1' provided with the electrode pattern 2a is cut into a desired size. Then, the film-shaped piezoelectric substance 1' provided with the electrode pattern cut into the desired size is joined to a front side and a back side of a conductive member 6a for the common electrode. Thereafter the leads L1 to L3 are connected to the feeding electrode 2, the common electrode 6, and the detecting electrode 8. Such a case will be taken as an example.

Figure 3A:
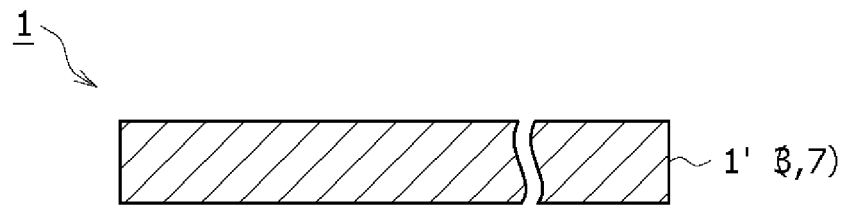
FIGS. 3A, 3B, and 3C are process diagrams representing an example (1) of manufacturing of the multifunction piezoelectric actuator 1.

With these manufacturing conditions, in FIG. 3A, a film-shaped piezoelectric substance 1' to be used as the piezoelectric element 3 and the piezoelectric element 7 is formed first. For example, piezoelectric substance material such as a ceramic in a powder form or the like, a solvent, a binder, a dispersing agent and the like are mixed with each other at a predetermined mixing ratio to form a mixed slurry not shown in the figure. As the solvent, acetone, toluene, ethanol, MEK or the like is used. As the binder, polyvinyl, alcohol, polyethylene or the like is used. About 10 w % of the binder is used.

Next, the mixed slurry is made to flow out into a uniform thickness. The film thickness is about 30 μm to 50 μm, for example. Thereafter, the solvent is evaporated and dried, whereby a film-shaped piezoelectric substance (green sheet) 1' is formed. Since the film-shaped piezoelectric substance 1' has a small thickness of about 30 μm, the film-shaped piezoelectric substance 1' is backed with a polymer film until a lamination process. A drying room is maintained at normal temperature or room temperature of 50 to 80° C., and the mixed slurry made to flow out into the uniform thickness is allowed to stand for a few ten minutes to be dried. The mixed slurry from which the solvent is removed forms the film-shaped piezoelectric substance 1'.

Figure 3B:
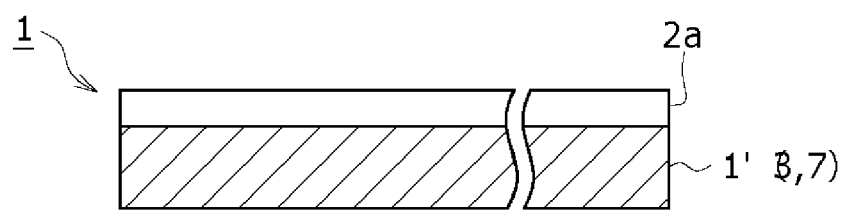

Then, as shown in FIG. 3B, an electrode pattern 2a is formed on one surface of the film-shaped piezoelectric substance 1'. Before this process, a process of making through holes is included. The electrode pattern 2a is for example formed by printing an electrode material at a predetermined position of the film-shaped piezoelectric substance 1'. The electrode printing is performed by screen printing. As the electrode material, an Ag—Pd alloy paste is used. The electrode pattern 2a forms the feeding electrode 2 and the detecting electrode 8 or the like in a subsequent process.

Figure 3C:
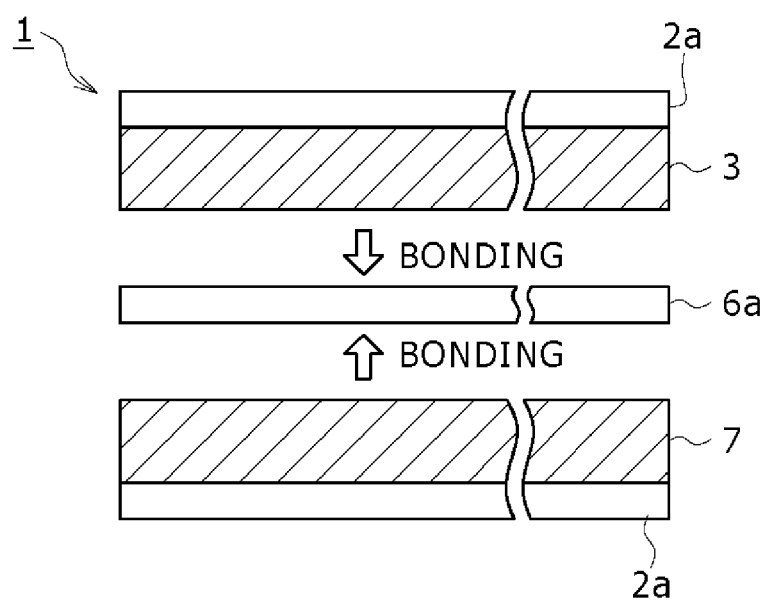

Next, in FIG. 3C, the film-shaped piezoelectric substance 1' previously printed with the electrode material is cut into a desired size. For example, a cutting device not shown in the figure is used to cut the film-shaped piezoelectric substance 1' into strips. This is to obtain the piezoelectric element 3 with the feeding electrode and the piezoelectric element 7 with the detecting electrode and the like. Then, in FIG. 3C, the film-shaped piezoelectric substance 1' in the form of a single layer forming the piezoelectric element 3 with the feeding electrode and the film-shaped piezoelectric substance 1' in the form of a single layer forming the piezoelectric element 7 with the detecting electrode are dried to remove the binder. As drying conditions in this case, the temperature is maintained at normal temperature or room temperature of about 400° C. to 500° C., and the film-shaped piezoelectric substance 1' is allowed to stand for a few ten minutes for degreasing. In practice, the temperature is increased to about 400° C. to 500° C. over a few days while a rate of the temperature increase is controlled in a furnace.

The film-shaped piezoelectric substance 1' in the form of a single layer from which the binder has previously been removed is fired. As firing conditions in this case, a firing temperature is about 10° C. to 1200° C., and a firing time is about 60 minutes. At this time, a degreasing process is similarly performed, and the temperature is increased to about 10° C. to 1200° C. over a few days while a rate of the temperature increase is controlled in a firing furnace.

Next, a conductive member 6a for the common electrode is prepared which has a size adapted to that of the film-shaped piezoelectric substance 1' in the form of a single layer forming the piezoelectric element 3 with the feeding electrode and the film-shaped piezoelectric substance 1' in the form of a single layer forming the piezoelectric element 7 with the detecting electrode. The conductive member 6a is cut into a size larger than that of the feeding electrode 2 and the detecting electrode 8, for example. This is to secure a soldering part at one end of the conductive member 6a to form the common electrode 6.

Figure 4A:
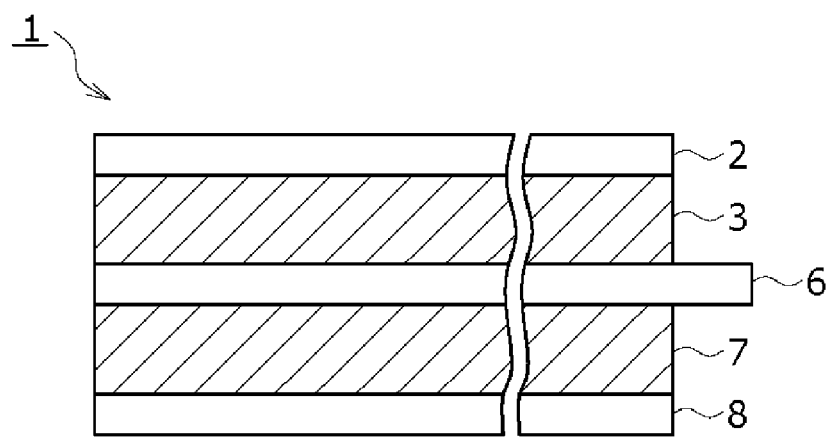
FIGS. 4A and 4B are process diagrams representing an example (2) of manufacturing of the multifunction piezoelectric actuator 1.

Then, the film-shaped piezoelectric substance 1' provided with the feeding electrode is bonded to a surface of the conductive member 6a for the common electrode shown in FIG. 4A. At this time, the polymer film for backing is removed, and then the piezoelectric element 3 is bonded to one surface of the common electrode 6. The feeding electrode 2 is faced upward. The film-shaped piezoelectric substance 1' provided with the detecting electrode is bonded to a back surface of the conductive member 6a. The piezoelectric element 7 is bonded to the other surface of the common electrode 6. The piezoelectric element 7 is bonded in an opposite direction to that of the piezoelectric element 3, that is, bonded such that the detecting electrode 8 is faced downward. Thus, the piezoelectric element 3 can be joined between the feeding electrode 2 and the common electrode 6. Also, the piezoelectric element 7 can be joined between the common electrode 6 and the detecting electrode 8. Incidentally, as a bonding material, an epoxy resin or a UV bonding agent is used.

Figure 4B:
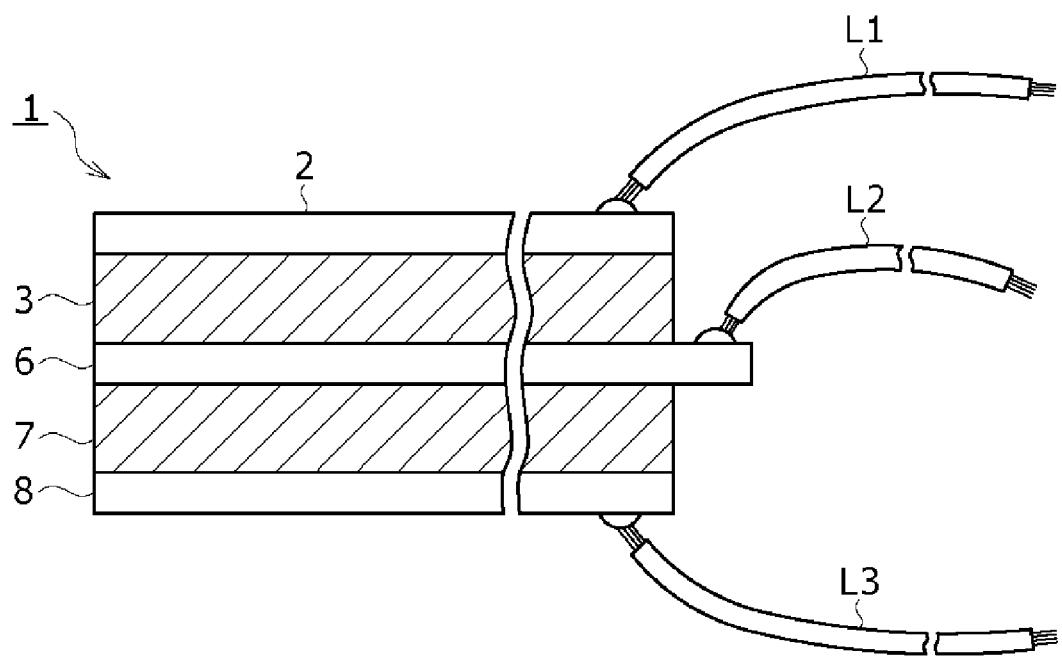

Thereafter, in FIG. 4B, leads L1 to L3 necessary for the multifunction piezoelectric actuator 1 to function as a piezoelectric actuator and a force detecting sensor are soldered to the feeding electrode 2, the common electrode 6, and the detecting electrode 8, respectively. The upper surface of the piezoelectric element 3 is covered with the feeding electrode 2, and the lead L1 is soldered to the terminal 9a of the feeding electrode 2. The lead L1 is used to supply a predetermined voltage between the feeding electrode 2 and the common electrode 6.

The lead L2 is soldered to the terminal 9b of the common electrode 6. The lead L2 is used in a grounded state (GND). The lower surface of the piezoelectric element 7 is covered with the detecting electrode 8, and the lead L3 is soldered to the terminal 9c of the detecting electrode 8. The lead L3 is used to detect a force detection signal (detection voltage Vd) between the detecting electrode 8 and the common electrode 6. Thus, the multifunction piezoelectric actuator 1 shown in FIGS. 1A and 1B and the like is completed. Thereafter a process of polarizing the piezoelectric elements is performed as required. The polarizing process refers to a process of aligning the molecular magnet of the piezoelectric elements in a certain direction by applying an external magnetization.

Thus the multifunction piezoelectric actuator 1 can be manufactured which combines the piezoelectric bimorph type actuator vibrating according to the predetermined voltage Va supplied between the feeding electrode 2 and the common electrode 6 with the force detecting sensor outputting the force detection signal based on the pressing force F'.

Thus, according to the multifunction piezoelectric actuator according to the first embodiment, a method of controlling the multifunction piezoelectric actuator, and a method of manufacturing the multifunction piezoelectric actuator, the piezoelectric element 3 is joined between the feeding electrode 2 and the common electrode 6, and the piezoelectric element 7 is joined between the common electrode 6 and the detecting electrode 8. With this laminated structure as a precondition, the control device 50 supplies the predetermined voltage Va between the feeding electrode 2 and the common electrode 6, and extracts the detection voltage Vd based on the external force (pressing force F') from the detecting electrode 8.

Thus, the single-layer piezoelectric substance 4a formed by the piezoelectric element 3 joined between the feeding electrode 2 and the common electrode 6 can perform an actuator function, and the single-layer piezoelectric substance 4b formed by the piezoelectric element 7 joined between the common electrode 6 and the detecting electrode 8 can perform a force detecting function.

With this structure, it is possible to provide the multifunction piezoelectric actuator 1 which combines the piezoelectric bimorph type actuator vibrating according to the predetermined voltage Va including an alternating current with a frequency of 50 Hz to 500 Hz with the force detecting sensor detecting the pressing force F'. In addition, since the actuator and the force detecting sensor are formed within an identical structure, as compared with a case where the actuator and the force detecting sensor are provided separately from each other, a mounting space is shared and thus an electronic device can be made more compact.

Figure 5A:
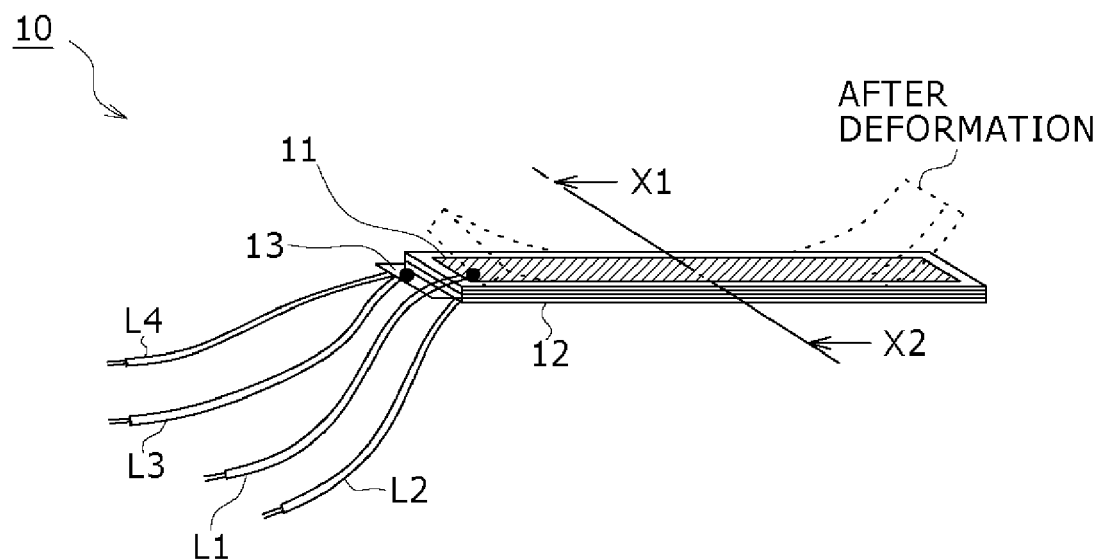
FIGS. 5A and 5B are diagrams showing an example of structure of a multifunction piezoelectric actuator (fixed connection type) 10 according to a second embodiment.
Figure 5B:
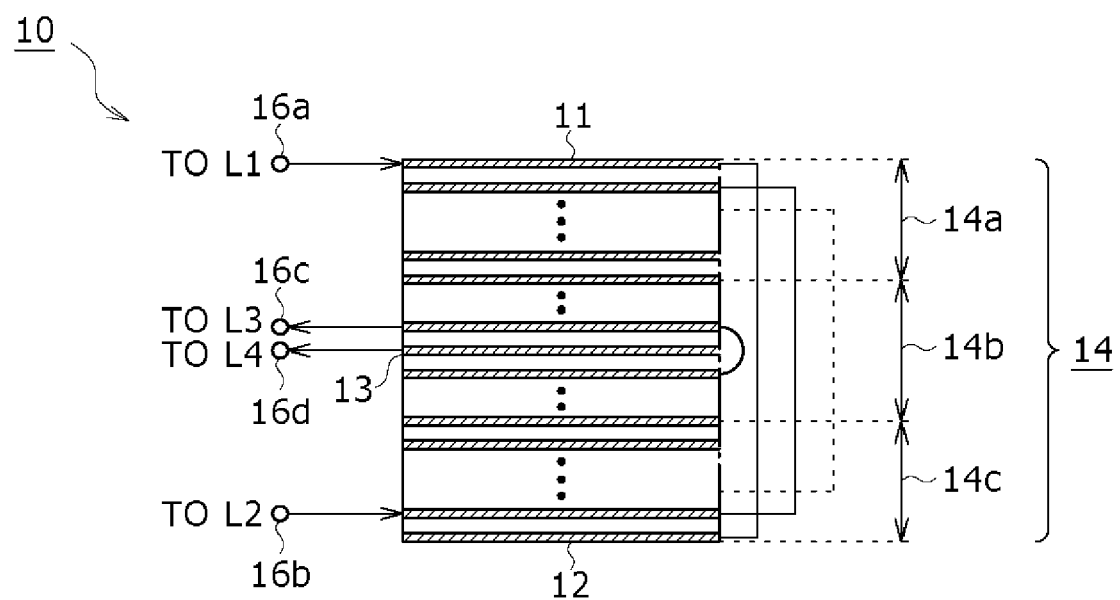

FIGS. 5A and 5B are diagrams showing an example of structure of a multifunction piezoelectric actuator (fixed connection type) 10 according to a second embodiment. FIG. 5A is a perspective view of the structure example. FIG. 5B is a sectional view taken along a line X1-X2 of FIG. 5A.

The second embodiment relates to an actuator in which piezoelectric elements having different amounts of distortion in two or more layers, or piezoelectric elements and a nonpiezoelectric element are bonded to each other, and a bend deformation of the bonded object which deformation is caused by a difference in the amounts of distortion of both the elements when a voltage is applied to the piezoelectric elements is used dynamically. The second embodiment includes two laminates formed by laminating one or more piezoelectric elements, and another laminate formed by lamination between these laminates and having one or more piezoelectric elements. The one or more piezoelectric elements can be vibrated by supplying power to lead electrodes of the former two laminates, and when a force is applied to the latter laminate, a force detection signal can be output from a lead electrode of the laminate.

The multifunction piezoelectric actuator 10 shown in FIG. 5A is an example of a piezoelectric composite device, and has the function of a piezoelectric actuator and the function of a force detecting sensor. As shown in FIG. 5B, the multifunction piezoelectric actuator 10 is formed by at least dividing (separating) one laminate 14 electrically into three laminated piezoelectric substance groups 14a, 14b, and 14c.

A central electrode 13 drawn out from a piezoelectric element situated at a center of the laminated piezoelectric substance group 14c in this example is used for force detection, and electrodes drawn out from piezoelectric elements of the other laminated piezoelectric substance groups 14a and 14b situated on both sides of the laminated piezoelectric substance group 14c are used for power supply. In this example, of one or more laminated piezoelectric substance groups 14a, 14b, and 14c divided electrically, the laminated piezoelectric substance group 14c including a neutral surface at the time of bend deformation is used for force detection, and the laminated piezoelectric substance groups 14a and 14b situated at a distance from the neutral surface are used for an actuator.

The central electrode 13 drawn out from the piezoelectric element situated at the center of the laminated piezoelectric substance group 14c in this example is used for a force detecting sensor, and the electrodes drawn out from the piezoelectric elements of the other laminated piezoelectric substance groups 14a and 14b situated on both sides of the laminated piezoelectric substance group 14c are used to supply power to the actuator. In this example, of one or more laminated piezoelectric substance groups 14a, 14b, and 14c divided electrically, the laminated piezoelectric substance group 14c including the neutral surface at the time of bend deformation is used as the force detecting sensor, and the laminated piezoelectric substance groups 14a and 14b situated at a distance from the neutral surface are used as the actuator.

The first laminated piezoelectric substance group 14a is an example of a first laminate, and is formed by laminating a lead electrode (hereinafter referred to as an upper part surface electrode 11) and one or more piezoelectric elements. Each piezoelectric element includes an electrode and a piezoelectric substance. The second laminated piezoelectric substance group 14b is an example of a second laminate, and is formed by laminating a lead electrode (hereinafter referred to as a lower part surface electrode 12) and one or more piezoelectric elements. Each piezoelectric element includes an electrode and a piezoelectric substance. The upper part surface electrode 11 and the lower part surface electrode 12 are connected to each other within the laminate. Other electrodes are also connected to each other within the laminate.

The third laminated piezoelectric substance group 14c is an example of a third laminate. The third laminated piezoelectric substance group 14c is laminated between the laminated piezoelectric substance group 14a and the laminated piezoelectric substance group 14b, and has one or more piezoelectric elements. The laminated piezoelectric substance group 14c has the central electrode 13 as an example of another lead electrode. The central electrode 13 is situated at the neutral surface of bend deformation of the laminated piezoelectric substance group 14a, the laminated piezoelectric substance group 14b, and the laminated piezoelectric substance group 14c.

The multifunction piezoelectric actuator 10 of a fixed connection type has four terminals 16a to 16d. The first terminal 16a is connected to the upper part surface electrode 11. The terminal 16a is connected with a lead L1. The second terminal 16b is connected to the lead electrode of the laminated piezoelectric substance group 14b. The terminal 16b is connected with a lead L2. The third terminal 16c is connected to the lead electrode of the laminated piezoelectric substance group 14c. The terminal 16c is connected with a lead L3. The fourth terminal 16d is connected to the lead electrode of the laminated piezoelectric substance group 14c. The terminal 16d is connected with a lead L4.

The multifunction piezoelectric actuator 10 of the fixed connection type is formed as described above. When actuator control section is connected to the lead L1 and the lead L2 and power is supplied to the piezoelectric elements of the laminated piezoelectric substance group 14a and the laminated piezoelectric substance group 14b via the terminal 16a and the terminal 16b, the laminated piezoelectric substance group 14a and the laminated piezoelectric substance group 14b vibrate. When an external force is applied to the piezoelectric elements of the laminated piezoelectric substance group 14c, a detection voltage Vd is output to the lead L3 and the lead L4.

Thus, according to the multifunction piezoelectric actuator according to the second embodiment and a method of handling the multifunction piezoelectric actuator, a laminate formed by laminating one or more piezoelectric elements is electrically divided into one or more laminated piezoelectric substance groups, and of the one or more laminated piezoelectric substance groups divided electrically, the laminated piezoelectric substance group 14c is made to function as a force detecting sensor for detecting an external force applied to the piezoelectric elements.

Hence, since a part of the multifunction piezoelectric actuator 10 functioning as a piezoelectric bimorph type actuator can be used as a force detecting sensor, the function of the actuator and the function of the force detecting sensor can be used at the same time. A composite function obtained by combining such functions can be realized. It is thus possible to provide for example the multifunction actuator 10 of a low voltage driving type that enables both the functions to be used simultaneously. In addition, since the actuator and the force detecting sensor are formed within an identical structure, as compared with a case where the actuator and the force detecting sensor are provided separately from each other, a mounting space is shared and thus an electronic device can be made more compact.

Figure 6:
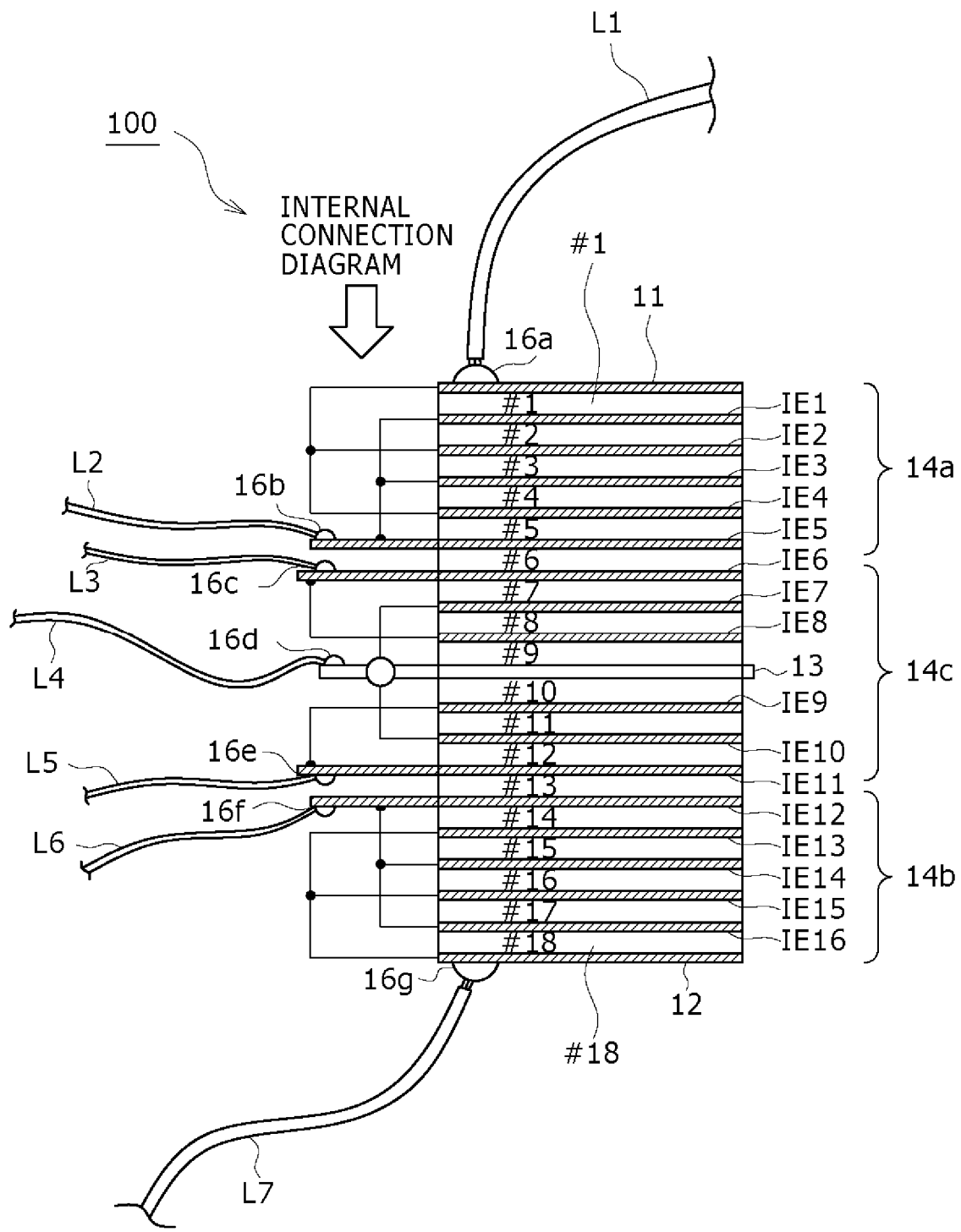
FIG. 6 is a diagram showing an example of sectional structure of a multifunction piezoelectric actuator 100 of a variable connection type according to a third embodiment and an example of internal connection of the multifunction piezoelectric actuator 100.

FIG. 6 is a diagram showing an example of sectional structure of a multifunction piezoelectric actuator 100 of a variable connection type according to a third embodiment and an example of internal connection of the multifunction piezoelectric actuator 100.

The multifunction piezoelectric actuator 100 of the variable connection type according to the third embodiment has seven leads L1 to L7, which are more than those of the fixed connection type by three. The multifunction piezoelectric actuator 100 shown in FIG. 6 makes the whole of a laminate function only as a piezoelectric actuator and makes the whole of the laminate function as a piezoelectric actuator and a force detecting sensor simultaneously.

The multifunction piezoelectric actuator 100 has a piezoelectric substance laminated between electrodes. The multifunction piezoelectric actuator 100 is formed by at least electrically dividing a laminate having a total of 18 layers of piezoelectric substance #1 to #18, an upper part surface electrode 11, a lower part surface electrode 12, a central electrode 13, and 16 layers of electrodes IE1 to IE16 into three laminated piezoelectric substance groups 14a, 14b, and 14c. Also in this case, as in the fixed connection type, the laminated piezoelectric substance group 14c is sandwiched between the laminated piezoelectric substance group 14a and the laminated piezoelectric substance group 14b.

The laminated piezoelectric substance group 14a includes the upper part surface electrode 11, the electrodes IE1 to IE5, and the five layers of piezoelectric substance #1 to #5. The laminated piezoelectric substance group 14a functions as a piezoelectric actuator. The piezoelectric substance #1 is laminated between the upper part surface electrode 11 and the electrode IE1. The piezoelectric substance #2 is laminated between the electrode IE1 and the electrode IE2. The piezoelectric substance #3 is laminated between the electrode IE2 and the electrode IE3. The piezoelectric substance #4 is laminated between the electrode IE3 and the electrode IE4. The piezoelectric substance #5 is laminated between the electrode IE4 and the lead electrode IE5.

The laminated piezoelectric substance group 14c is laminated between the laminated piezoelectric substance group 14a and the laminated piezoelectric substance group 14b. The laminated piezoelectric substance group 14c includes the central electrode 13, the electrodes IE6 to IE8, four layers of piezoelectric substance, the electrodes IE9 to IE11, and four layers of piezoelectric substance. The laminated piezoelectric substance group 14c functions as a force detecting sensor. The piezoelectric substance #6 is laminated between the electrode IE5 and the electrode IE6. The piezoelectric substance #7 is laminated between the electrode IE6 and the electrode IE7. The piezoelectric substance #8 is laminated between the electrode IE7 and the electrode IE8. The piezoelectric substance #9 is laminated between the electrode IE8 and the central electrode 13.

The piezoelectric substance #10 is laminated between the central electrode 13 and the electrode IE9. The piezoelectric substance #11 is laminated between the electrode IE9 and the electrode IE10. The piezoelectric substance #12 is laminated between the electrode IE10 and the electrode IE11. The central electrode 13 is situated at a neutral surface of bend deformation of the laminated piezoelectric substance group 14a, the laminated piezoelectric substance group 14b, and the laminated piezoelectric substance group 14c.

The laminated piezoelectric substance group 14b includes the lower part surface electrode 12, the electrodes IE12 to IE16, and five layers of piezoelectric substance. The laminated piezoelectric substance group 14b functions as a piezoelectric actuator. The piezoelectric substance #13 is laminated between the electrode IE11 and the electrode IE12. The piezoelectric substance #14 is laminated between the electrode IE12 and the electrode IE13. The piezoelectric substance #15 is laminated between the electrode IE13 and the electrode IE14. The piezoelectric substance #16 is laminated between the electrode IE14 and the electrode IE15. The piezoelectric substance #17 is laminated between the electrode IE15 and the electrode IE16. The piezoelectric substance #18 is laminated between the electrode IE16 and the lower part surface electrode 12.

The upper part surface electrode 11, the electrode IE2, and the electrode IE4 in the laminated piezoelectric substance group 14a in FIG. 6 are connected to each other within the laminate. The upper part surface electrode 11 is connected to the lead L1 via a first terminal 16a. The electrode IE1 and the electrode IE3 are connected to the lead electrode IE5 within the laminate. The lead electrode IE5 is connected to the lead L2 via a second terminal 16b.

The electrode IE8 of the laminated piezoelectric substance group 14c is connected to the lead electrode IE6 within the laminate. The lead electrode IE6 is connected to the lead L3 via a terminal 16c. The electrode IE7 and the electrode IE10 are connected to the central electrode 13. The central electrode 13 is connected to the lead L4 via a terminal 16d. The electrode IE9 is connected to the lead electrode IE11 within the laminate. The lead electrode IE11 is connected to the lead L5 via a terminal 16e.

The electrode IE14 and the electrode IE16 of the laminated piezoelectric substance group 14b are connected to the lead electrode IE12 within the laminate. The lead electrode IE12 is connected to the lead L6 via a terminal 16f. The electrode IE13 and the electrode IE15 are connected to the lower part surface electrode 12 within the laminate. The lower part surface electrode 12 is connected to the lead L7 via a terminal 16g.

Incidentally, in FIG. 6, the piezoelectric substances #8 to #12 shown at positions near the central electrode 13 function as the force detecting sensor. The piezoelectric substances #1 to #5 and the piezoelectric substances #14 to #18 outlined over and under the piezoelectric substances #8 to #12 form a part functioning as the actuator 100. The piezoelectric substances #6 and #13 are positioned at a boundary between the actuator and the force detecting sensor, and function as a cushioning material.

Figure 7A:
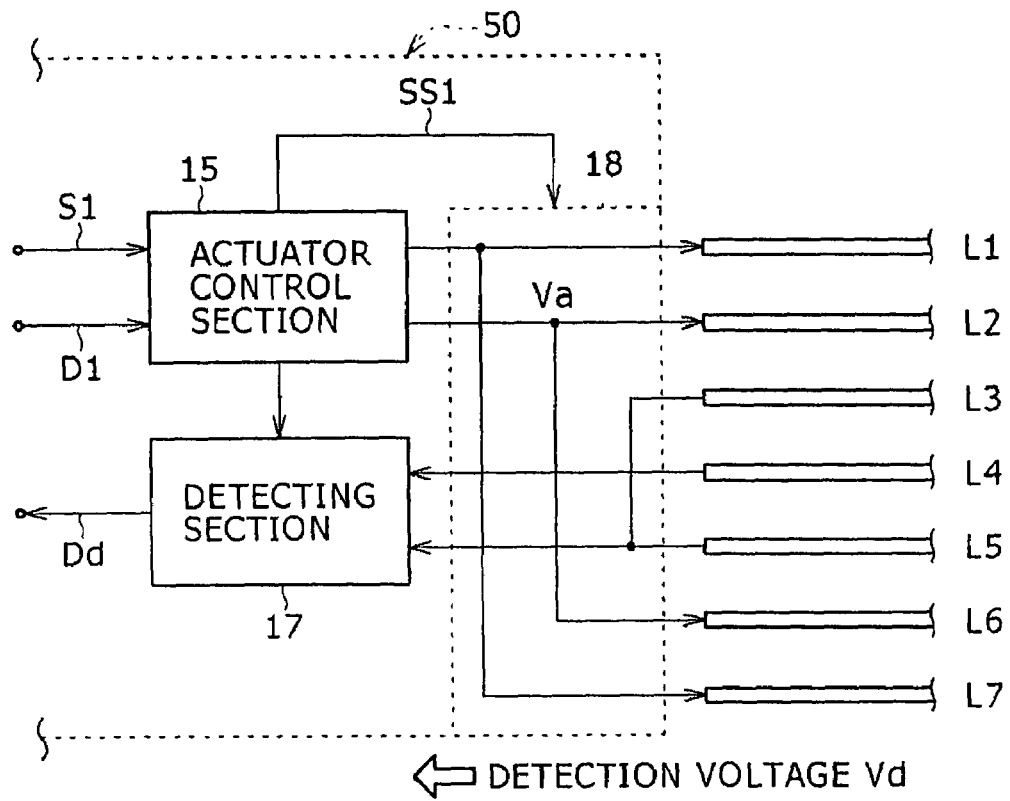
FIGS. 7A and 7B are block diagrams showing examples of configuration of a control system for the multifunction piezoelectric actuator 100.
Figure 7B:
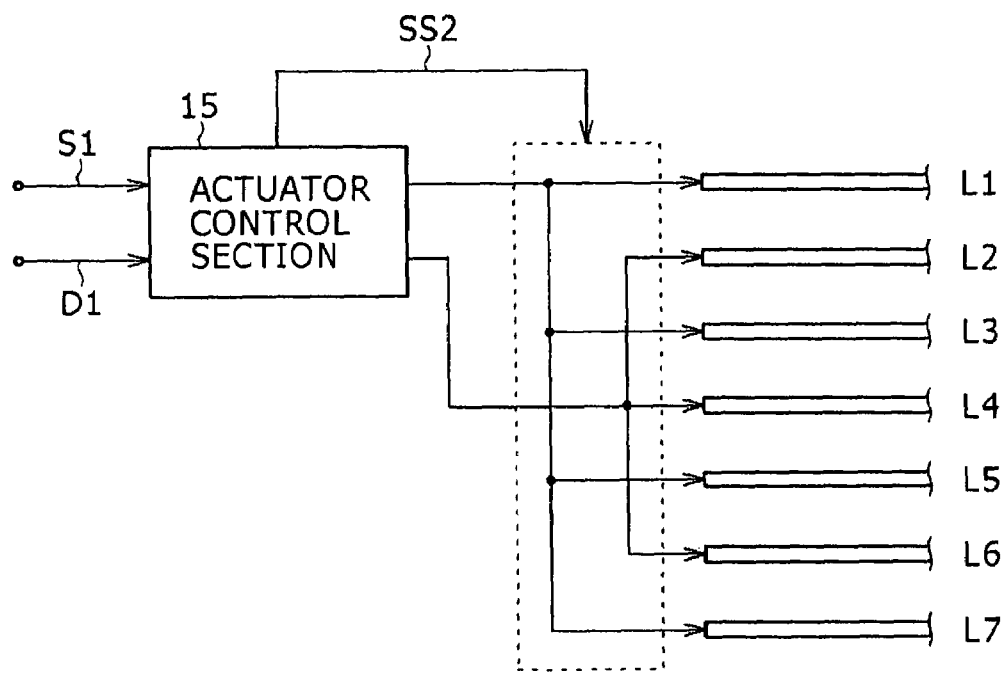

FIGS. 7A and 7B are block diagrams showing examples of configuration of a control system for the multifunction piezoelectric actuator 100.

In this example, a control device 50 is provided which is connected to the upper part surface electrode 11, the electrode IE5, the electrode IE6, the central electrode 13, the electrode IE11, the electrode IE12, and the lower part surface electrode 12 of the laminated piezoelectric substance groups 14a to 14c. According to a preset control signal, the control device 50 supplies power to the upper part surface electrode 11, the electrode IE5, the electrode IE12, and the lower part surface electrode 12 of the laminated piezoelectric substance groups 14a and 14b, and the control device 50 supplies power to the electrode IE6, the central electrode 13, and the electrode IE11 of the laminated piezoelectric substance group 14c or the control device 50 detects a force detection signal Sout from the electrode IE6, the central electrode 13, and the electrode IE11.

The control device 50 shown in FIG. 7A has actuator control section 15, detecting section 17, and a connecting circuit 18. In this case, the control device 50 makes the multifunction piezoelectric actuator 100 function as the piezoelectric actuator and the force detecting sensor simultaneously. The connecting circuit 18 is formed by a gate array using a MOSFET switch circuit, for example. The actuator control section 15 is connected to a higher-level control system. The actuator control section 15 is for example supplied with vibration waveform pattern data D1 and a function selecting signal S1 as an example of a control signal from the higher-level control system. The actuator control section 15 drives and controls the multifunction piezoelectric actuator 100 on the basis of the vibration waveform pattern data D1 and the function selecting signal S1.

When the function selecting signal S1 is to make the multifunction piezoelectric actuator 100 function as the piezoelectric actuator and the force detecting sensor simultaneously, for example, the actuator control section 15 outputs a switch connecting signal SS1 to the connecting circuit 18 to connect the lead L1 with the lead L7. Also, the lead L2 and the lead L6 are connected to each other, and connected to the actuator control section 15. Thereby an actuator circuit including the piezoelectric substances #1 to #5 and the piezoelectric substances #14 to #18 of the laminated piezoelectric substance group 14a and the laminated piezoelectric substance group 14b can be constructed via the terminals 16a, 16b, 16f, and 16g shown in FIG. 6.

Further, on the basis of the switch connecting signal SS1, the actuator control section 15 connects the lead L3 and the lead L5 to each other, and connects the lead L3 and the lead L5 and the lead L4 to the detecting section 17. Thereby a force detecting sensor circuit including the central electrode 13 and the piezoelectric substances #7 to #12 of the laminated piezoelectric substance group 14c can be constructed via the terminals 16c, 16d, and 16e shown in FIG. 6.

With such an actuator circuit and such a force detecting sensor circuit constructed, the actuator control section 15 generates an actuator driving voltage Va based on the vibration waveform pattern data D1. When the actuator driving voltage Va is supplied through the leads L1, L2, L6, and L7 to the piezoelectric substances #1 to #5 and the piezoelectric substances #14 to #18 of the laminated piezoelectric substance group 14a and the laminated piezoelectric substance group 14b via the terminals 16a, 16b, 16f, and 16g shown in FIG. 6, the laminated piezoelectric substance group 14a vibrates so as to elongate, and the laminated piezoelectric substance group 14b vibrates so as to contract with the central electrode 13 as a reference. Thus the multifunction piezoelectric actuator 100 can be operated as an actuator.

When an external force is applied to the piezoelectric substances #7 to #12 of the laminated piezoelectric substance group 14c in this state or in a state in which the actuator driving voltage Va is not supplied, a force detection voltage Vd occurs in the lead L3 and the lead L5. The force detection voltage Vd is output to the detecting section 17. The detecting section 17 for example detects the force detection voltage Vd, and outputs the force detection voltage Vd as a force detection signal Sout to the higher-level control system. Thus the multifunction piezoelectric actuator 100 can also be operated as a force detecting sensor while the actuator function of the multifunction piezoelectric actuator 100 is retained.

A control system shown in FIG. 7B makes the multifunction piezoelectric actuator 100 function only as a piezoelectric actuator. In this case, the actuator control section 15 is supplied with the vibration waveform pattern data D1 and the function selecting signal S1 from the higher-level control system. The actuator control section 15 drives and controls the multifunction piezoelectric actuator 100 on the basis of the vibration waveform pattern data D1 and the function selecting signal S1.

When the function selecting signal S1 is to make the multifunction piezoelectric actuator 100 function only as the piezoelectric actuator, for example, the actuator control section 15 outputs a switch connecting signal SS2 to the connecting circuit 18 to connect the leads L1, L3, L5, and L7 with each other. Also, the leads L2, L4, and L6 are connected to each other, and connected to the actuator control section 15. Thereby an actuator circuit including the piezoelectric substances #1 to #18 of the laminated piezoelectric substance group 14a, the laminated piezoelectric substance group 14c, and the laminated piezoelectric substance group 14b can be constructed via the terminals 16a, 16b, 16c, 16d, 16e, 16f, and 16g shown in FIG. 6.

With such an actuator circuit constructed, the actuator control section 15 generates the actuator driving voltage Va based on the vibration waveform pattern data D1. When the actuator driving voltage Va is supplied through the leads L1, L2, L3, L4, L5, L6, and L7 to the piezoelectric substances #1 to #18 of the laminated piezoelectric substance group 14a, the laminated piezoelectric substance group 14c, and the laminated piezoelectric substance group 14b via the terminals 16a, 16b, 16c, 16d, 16e, 16f, and 16g shown in FIG. 6, the laminated piezoelectric substance group 14a and an upper half of the laminated piezoelectric substance group 14c vibrate so as to elongate, and a lower half of the laminated piezoelectric substance group 14c and the laminated piezoelectric substance group 14b vibrate so as to contract with the central electrode 13 as a reference. Thus the whole of the laminate of the multifunction piezoelectric actuator 100 can be operated as an actuator.

Thus, according to a method of controlling the multifunction piezoelectric actuator according to the third embodiment, the control device 50 is connected to the upper part surface electrode 11, the electrode IE5, the electrode IE6, the central electrode 13, the electrode IE11, the electrode IE12, and the lower part surface electrode 12 of the laminated piezoelectric substance groups 14a, 14b, and 14c including the 18 laminated layers of piezoelectric substance #1 to #18. The control device 50 supplies power to the upper part surface electrode 11, the electrode IE5, the electrode IE12, and the lower part surface electrode 12 of the laminated piezoelectric substance groups 14a and 14b according to the preset function selecting signal SS1 or the like, and detects a detection voltage Vd from the electrode IE6, the central electrode 13, and the electrode IE11 of the laminated piezoelectric substance group 14c.

As a result, an actuator function can be performed by the laminated piezoelectric substance groups 14a and 14b, and a force detecting function can be performed by the laminated piezoelectric substance group 14c. In addition, when power is supplied to each of the upper part surface electrode 11, the electrode IE5, the electrode IE6, the central electrode 13, the electrode IE11, the electrode IE12, and the lower part surface electrode 12 of the laminated piezoelectric substance groups 14a, 14b, and 14c, an actuator function can be performed by the laminated piezoelectric substance groups 14a, 14b, and 14c. Thus, function changing control, which for example makes the piezoelectric substance #7 to #12 of the laminated piezoelectric substance group 14c performing the force detecting function function as an actuator according to circumstances, can be performed.

Figure 8:
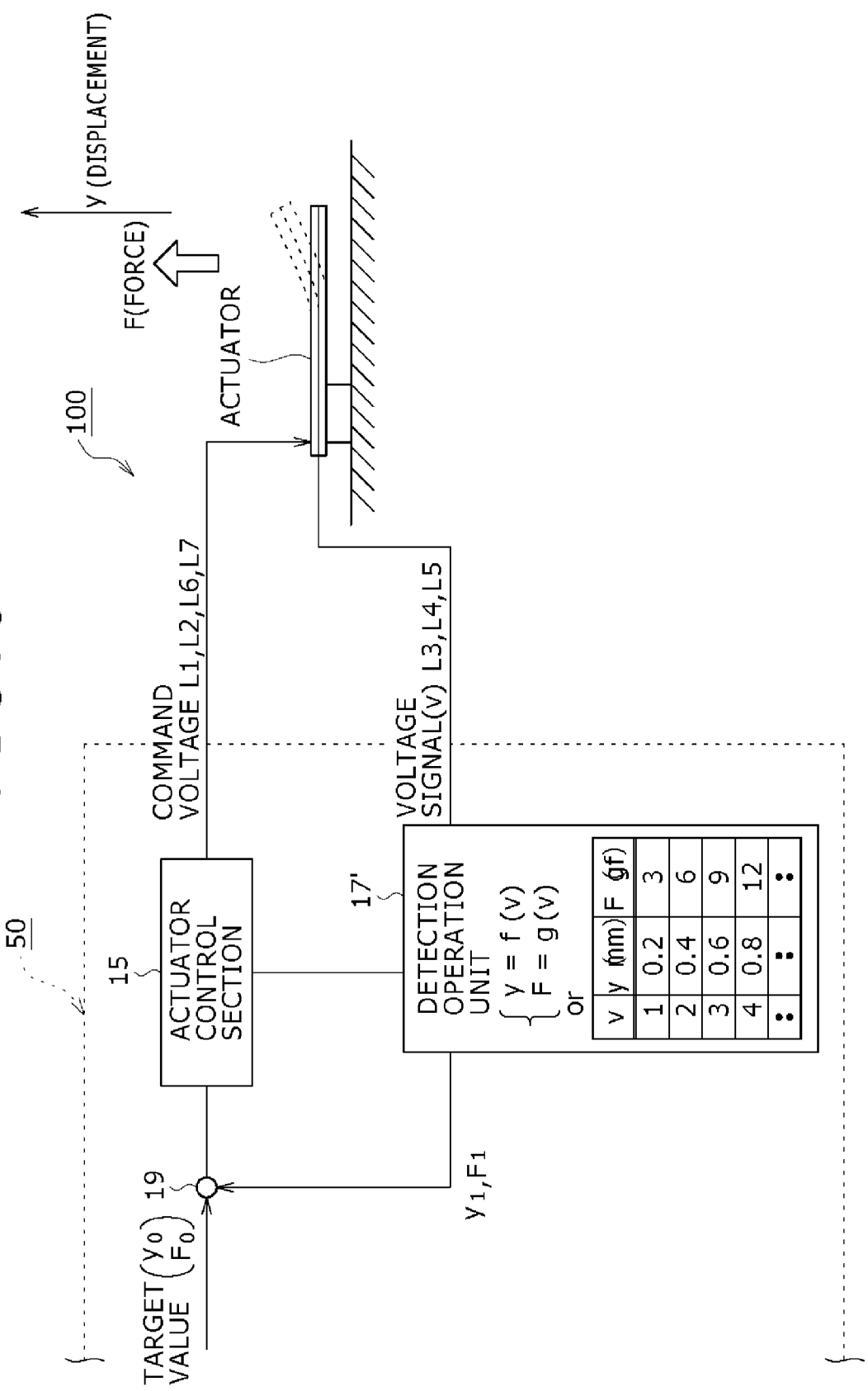
FIG. 8 is a block diagram showing an example of feedback control of the multifunction piezoelectric actuator 100.

FIG. 8 is a block diagram showing an example of feedback control of the multifunction piezoelectric actuator 100.

The control device 50 shown in FIG. 8 has actuator control section 15, a detection operation unit 17', and a comparator 19. The control device 50 performs feedback control (servo control; closed loop actuator control) of the multifunction piezoelectric actuator 100 on the basis of a control target value (y0, F0). The control target value y0 represents a displacement. The control target value F0 represents a force. The letter y denotes displacement by operation of the multifunction piezoelectric actuator 100. F denotes force generated by operation of the actuator 100. Generally, when the positioning of an object is controlled, the displacement y is selected as a controlled quantity, and when the force F exerted by the actuator 100 on another object or the like is controlled, the force F is selected as a controlled quantity.

The actuator control section 15 in this example is connected with the multifunction piezoelectric actuator 100 via a single line representing the leads L1, L2, L6, and L7 shown in FIG. 7A. The actuator control section 15 determines a command voltage on the basis of the control target value y0 or F0 given to the actuator control section 15 in advance, and applies the command voltage to the laminated piezoelectric substance groups 14a and 14b functioning as the actuator in the multifunction piezoelectric actuator 100.

A connection between the above-described multifunction piezoelectric actuator 100 and the detection operation unit 17' is made by a single line representing the leads L3, L4, and L5 shown in FIG. 7A. The detection operation unit 17' is an example of detector. The detection operation unit 17' converts a detection voltage Vd output from the multifunction piezoelectric actuator 100 into two control quantities. The detection operation unit 17' is provided in advance with functions y=f(v) and F=g(v) defining a relation between the detection voltage Vd (=v) and the displacement y or between the detection voltage Vd (=v) and the force F or a conversion table.

The conversion table stores for example the displacement y=0.2, 0.4, 0.6, 0.8 . . . [m] and the force F=3, 6, 9, 12 . . . [gf] for voltage v=1, 2, 3, 4 . . . Let y1 or F1 be a control quantity after conversion. The comparator 19 is connected to the detection operation unit 17' to compare the control quantity y1 or F1 after conversion with the control target value (y0, F0). A result of the comparison is output to the actuator control section 15 to determine a new command voltage.

The detection voltage Vd occurring in the laminated piezoelectric substance group 14c functioning as force detecting sensor as a result of the actuator 100 being in operation is output to the detection operation unit 17'. The detection voltage Vd is converted into a necessary control quantity y1 or F1 by the detection operation unit 17', and then compared with the target value (y0, F0) at the comparator 19. On the basis of a result of the comparison, the actuator control section 15 determines a new command voltage. The new command voltage is applied to the laminated piezoelectric substance groups 14a and 14b functioning as actuator in the multifunction piezoelectric actuator 100.

While the piezoelectric substances functioning as the actuator and the piezoelectric substances functioning as the sensor in the multifunction piezoelectric actuator 100 according to the third embodiment of the present invention are mechanically within an identical structure and close to each other, the piezoelectric substances functioning as the actuator and the piezoelectric substances functioning as the sensor are electrically independent of each other. In this respect, a part of the multifunction piezoelectric actuator 100 functioning as a piezoelectric bimorph type actuator can be used as a force detecting sensor. Therefore the function of the actuator and the function of the force detecting sensor can be used at the same time. In addition, as compared with a case where the actuator 100 and the force detecting sensor are provided separately from each other, a mounting space is shared and thus an electronic device can be made more compact.

FIGS. 9A, 9B, and 9C, FIGS. 10A, 10B, and 10C, and FIGS. 13A to 15B are process diagrams representing examples (1 to 5) of formation of the multifunction piezoelectric actuator 100. FIGS. 11A, 11B, 11C, and 11D and FIG. 12 are diagrams showing an example of electrode patterns and an example of lamination of a film-shaped piezoelectric substance, the diagrams being supplementary to the process diagrams.

In the third embodiment, a laminate having the upper part surface electrode 11, the lower part surface electrode 12, the central electrode 13, and the 16 layers of the electrodes IE1 to IE16 as shown in FIG. 6 is formed. Then the laminate is divided electrically to demarcate at least three laminated piezoelectric substance groups 14a, 14b, and 14c. The central electrode 13 is drawn out from the piezoelectric substances #9 and #10 situated at a center of the laminated piezoelectric substance group 14c after demarcation. Other electrodes IE6 and IE11 are drawn out from the piezoelectric substances #6 and #12 situated in the laminated piezoelectric substance group 14c at the center of the laminate. That is, at least the two electrodes IE6 and IE11 and the one central electrode 13 are drawn out from the laminated piezoelectric substance group 14c situated at the center.

Figure 9A:
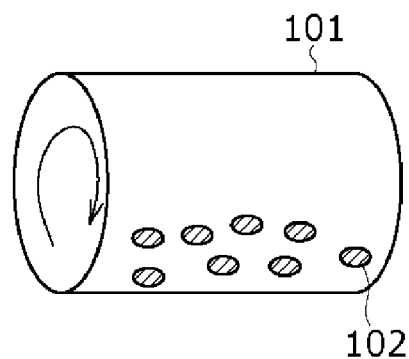
FIGS. 9A, 9B, and 9C are process diagrams representing an example (1) of manufacturing of the multifunction piezoelectric actuator 100.

With these manufacturing conditions, in FIG. 9A, piezoelectric substance material such as a ceramic in a powder form or the like, a solvent, a binder, a dispersing agent and the like are put into a predetermined mixer 101 and mixed with each other to form a mixed slurry 102. As the solvent, acetone, toluene, ethanol, MEK or the like is used. As the binder, polyvinyl, alcohol, polyethylene or the like is used. About 10 w % of the binder is used.

Figure 9B:
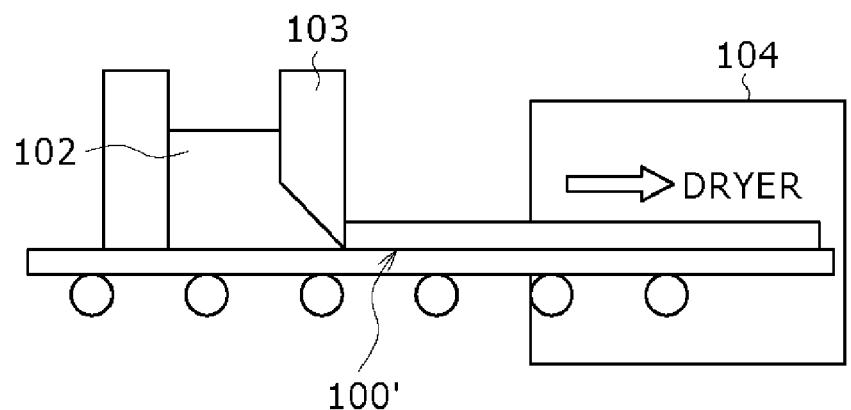

Next, in FIG. 9B, the mixed slurry 102 is made to flow out into a uniform thickness by using a doctor blade 103. The film thickness is about 30 μm to 50 μm, for example. Thereafter, the solvent is evaporated and dried, whereby a green sheet is formed. For example, a drying room 104 is maintained at normal temperature or room temperature of about 50 to 80° C., and the mixed slurry 102 made to flow out into the uniform thickness is allowed to stand for a few ten minutes to be dried. The mixed slurry 102 from which the solvent is removed forms a film-shaped piezoelectric substance (green sheet) 100'.

Figure 9C:
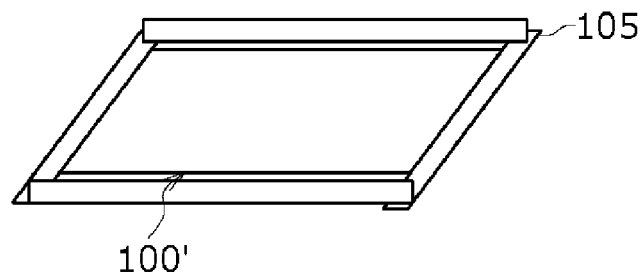

Thereafter the film-shaped piezoelectric substance 100' is cut into a predetermined size. In FIG. 9C, the film-shaped piezoelectric substance 100' is mounted in a predetermined frame 105. The film-shaped piezoelectric substance 100' is cut into a square shape and a size of about 200 mm×200 mm.

Figure 10A:
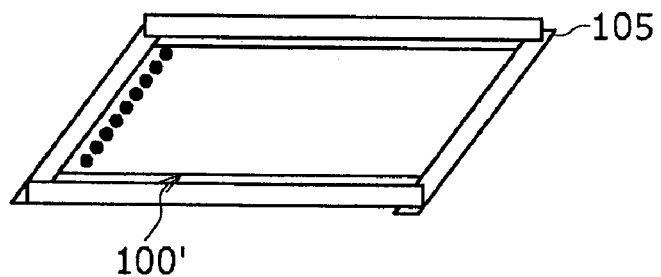
FIGS. 10A, 10B, and 10C are process diagrams representing an example (2) of manufacturing of the multifunction piezoelectric actuator 100.

Next, in FIG. 10A, openings are provided at predetermined positions of the film-shaped piezoelectric substance 100' previously mounted in the frame 105 to form through holes not shown in the figure. The through holes are made to electrically connect a main electrode IE in each layer to a wiring electrode (land) provided on a surface. An opening diameter is about 0.1 μmφ to 0.2 μmφ.

Figure 10B:
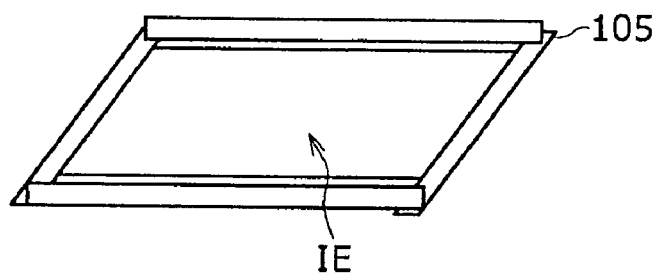

Further, in FIG. 10B, an electrode material is printed at a predetermined position of the film-shaped piezoelectric substance 100' in which the through holes have previously been made. The electrode printing is performed by screen printing. As the electrode material, a Ag—Pd alloy paste is used. For printing of an electrode of each layer, screens that serve to provide four kinds of electrode patterns P1 to P4 shown in FIG. 11A to 11D are prepared. Basically, one main electrode IE and four wiring electrodes (lands), for example, are arranged on each screen. The lands are aligned with opening parts (through holes) for interlayer connection. The screens are formed such that an electrode IE is connected to one of the lands R1, R2, R3, and R4 situated at respective different positions in each layer.

Figure 11A:
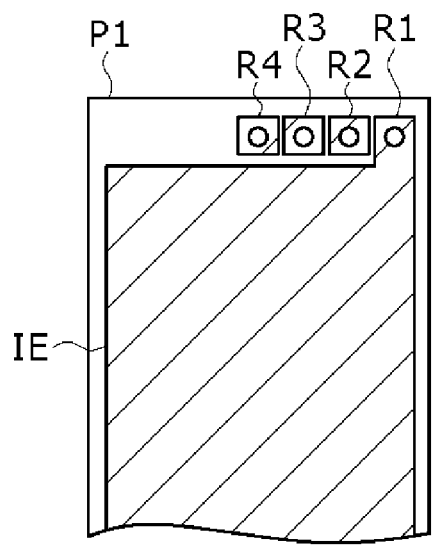
FIGS. 11A, 11B, 11C, and 11D are top views showing an example of electrode patterns, the top views being supplementary to the process diagrams.

In the electrode pattern P1 shown in FIG. 11A, the main electrode IE and the first land R1 are connected to each other. The electrode pattern P1 is applied to the upper part surface electrode 11, the electrode IE2, and the electrode IE4 in the laminated piezoelectric substance group 14a. The first land R1 forms the terminal 16a. The electrode pattern P1 is applied to the lower part surface electrode 12, the electrode IE15, and the electrode IE13 in the laminated piezoelectric substance group 14b. The land R1 forms the terminal 16g.

Figure 11B:
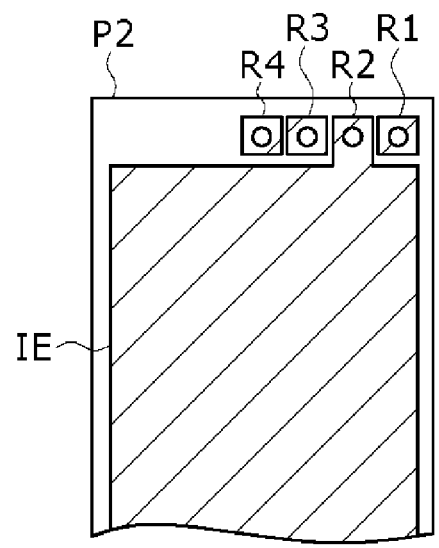

In the electrode pattern P2 shown in FIG. 11B, the main electrode IE and the second land R2 are connected to each other. The electrode pattern P2 is applied to the electrodes IE1, IE3, and IE5 in the laminated piezoelectric substance group 14a. The land R2 forms the terminal 16b. The electrode pattern P2 is applied to the electrodes IE16, IE14, and IE12 in the laminated piezoelectric substance group 14b. The land R2 forms the terminal 16f.

Figure 11C:
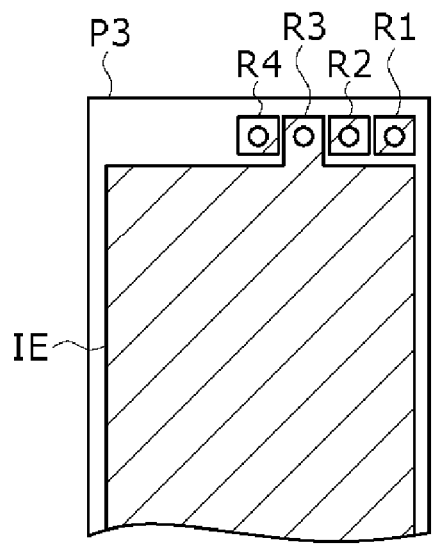
Figure 11D:
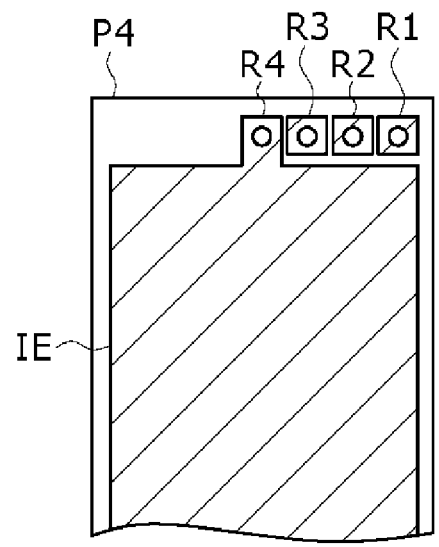

In the electrode pattern P3 shown in FIG. 11C, the main electrode IE and the third land R3 are connected to each other. The electrode pattern P3 is applied to the electrodes IE6 and IE8 in the laminated piezoelectric substance group 14a. The land R3 forms the terminal 16c. The electrode pattern P3 is applied to the electrodes IE9 and IE11 in the laminated piezoelectric substance group 14b. The land R3 forms the terminal 16e.

In the electrode pattern P4 shown in FIG. 1D, the main electrode IE and the fourth land R4 are connected to each other. The electrode pattern P4 is applied to the electrode IE7 in the laminated piezoelectric substance group 14a. The land R4 is connected to the central electrode 13 to form the terminal 16d. The electrode pattern P4 is applied to the electrode IE10 in the laminated piezoelectric substance group 14b. The land R4 is connected to the above-mentioned central electrode 13 to form the terminal 16d. Incidentally, the through holes made in FIG. 10A are made in substantially central parts of the lands R1 to R4. When the electrodes are printed, printing is preferably repeated a plurality of times in order to supply a sufficient amount of electrode material inside the through holes.

Figure 10C:
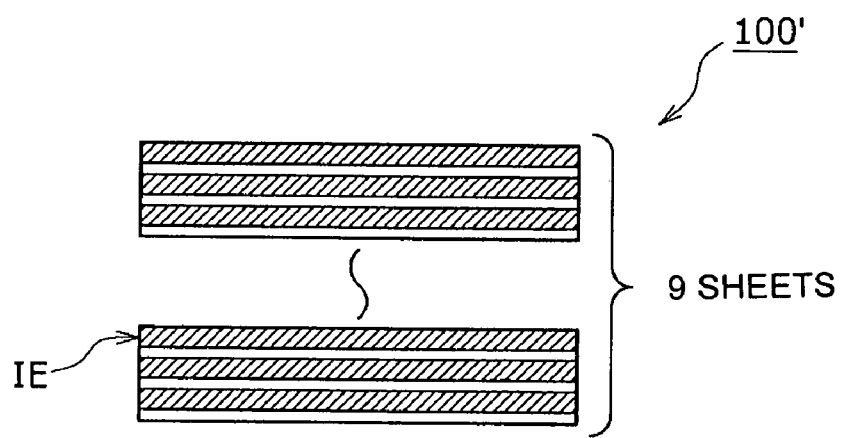

Thereafter, in FIG. 10C, a predetermined number of sheets of the film-shaped piezoelectric substance 100' previously printed with the electrode material are laminated into layers in parallel with bonding surfaces. In this example, the laminated piezoelectric substance group 14a is formed by nine sheets of the film-shaped piezoelectric substance 100' printed with the electrode material. Similarly, the laminated piezoelectric substance group 14b is formed by nine sheets of the film-shaped piezoelectric substance 100'.

Figure 12:
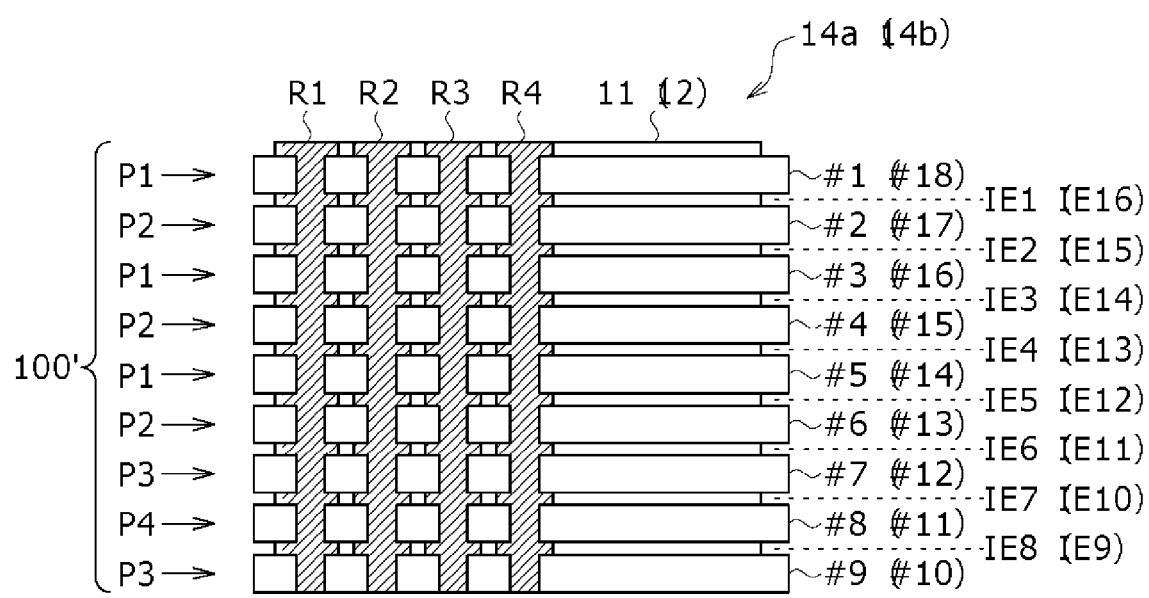
FIG. 12 is a sectional view showing an example of lamination of a film-shaped piezoelectric substance 100', the sectional view being supplementary to the process diagrams.

In this example, as shown in FIG. 12, both the laminated piezoelectric substance group 14a and the laminated piezoelectric substance group 14b are formed by laminating the film-shaped piezoelectric substances 100' in order of the electrode patterns P1, P2, P1, P2, P1, P2, P3, P4, and P3 from the top. By this lamination, an identical electrode pattern (both the main electrode IE and the land) can be assigned to every other layer in each of functional units of the actuator and the force detecting sensor. Therefore internally homogeneous electrode patterns can be connected. FIG. 12 is a sectional view showing an example of formation of a through hole part. The lands R1 to R4 in each layer are connected by the electrode material filled into the through holes. This allows a point of feeding to the main electrode IE in each layer to be drawn out to an upper part surface layer.

Figure 13A:
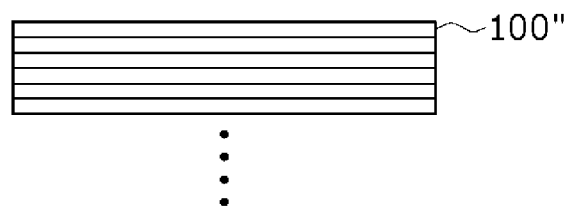
FIGS. 13A, 13B, and 13C are process diagrams representing an example (3) of manufacturing of the multifunction piezoelectric actuator.

Next, in FIG. 13A, the nine sheets of the film-shaped piezoelectric substance 100' previously printed with the electrode material are subjected to thermocompression bonding to form a green sheet (laminated material) 100" in a laminated form. As conditions of thermocompression at this time, the temperature is about 60° C. to 100° C., applied pressure is about 100 kg/cm$^2$, and a thermocompression bonding time is about a few ten minutes.

Figure 13B:
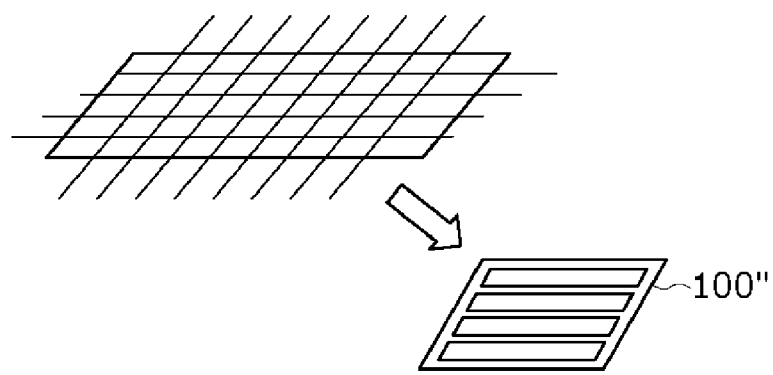
Figure 13C:
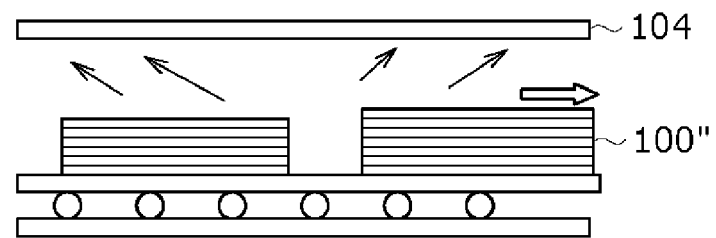

Then, in FIG. 13B, the green sheet 100" in the laminated form resulting from the previous thermocompression bonding is cut into a predetermined size. For example, a cutting device not shown in the figure is used to cut the green sheet 100" into strips. This is to obtain the laminated piezoelectric substance group 14a and the laminated piezoelectric substance group 14b and the like. Then, in FIG. 13C, the green sheet 100" in the laminated form are brought into the drying room 104 to remove the binder from the green sheet 100" in the drying room 104. As drying conditions in this case, the temperature is maintained at normal temperature or room temperature of about 400° C. to 500° C., and the green sheet 100" is allowed to stand for a few ten minutes for degreasing. In practice, the temperature is increased to about 400° C. to 500° C. over a few days while a rate of the temperature increase is controlled in a furnace.

In FIG. 14A, the green sheet 100" in the laminated form from which the binder has previously been removed is brought into a firing device 106 to be fired. As firing conditions in this case, a firing temperature is about 1000° C. to 1200° C., and a firing time is about 60 minutes. At this time, a degreasing process is similarly performed, and the temperature is increased to about 1000° C. to 1200° C. over a few days while a rate of the temperature increase is controlled in the firing furnace.

Thereafter, in FIG. 14B, the previously fired green sheet 100" in the laminated form is cut by a grindstone 107 to form individual laminated piezoelectric substance groups 14a and 14b. Reference numeral 40 denotes a path of the grindstone 107. The grindstone 107 goes around the green sheet 100" on a front surface and a back surface of the green sheet 100", and thus cuts the green sheet 100". The laminated piezoelectric substance group 14a as shown in FIG. 14C is thereby obtained. A laminated piezoelectric substance group 14a is used as the laminated piezoelectric substance group 14b.

Figure 15A:
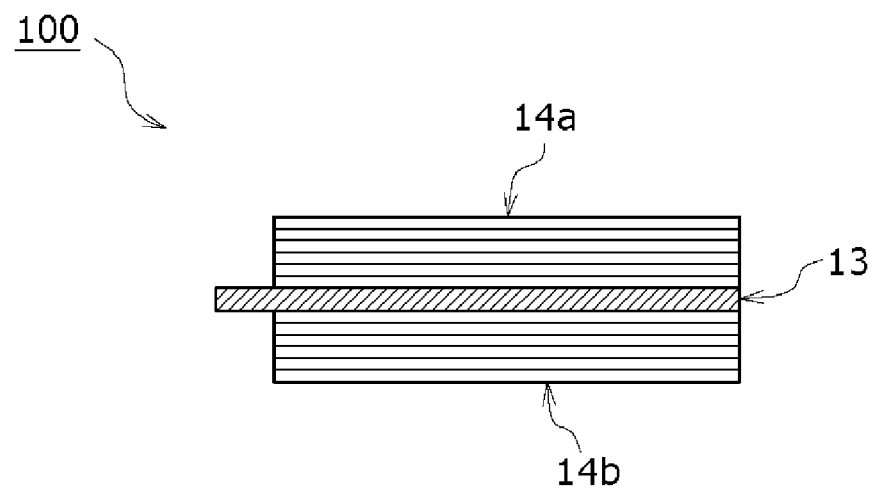
FIGS. 15A and 15B are process diagrams representing an example (5) of manufacturing of the multifunction piezoelectric actuator.

Then, in FIG. 15A, a central electrode 13 of a predetermined size is prepared, and the laminated piezoelectric substance groups 14a and 14b are bonded to both sides of the central electrode 13. At this time, the laminated piezoelectric substance group 14a is bonded to one surface of the central electrode 13, and the laminated piezoelectric substance group 14b is bonded to the other surface of the central electrode 13. The laminated piezoelectric substance group 14b is bonded to the other surface of the central electrode 13 such that the laminated piezoelectric substance group 14b faces in an opposite direction to that of the laminated piezoelectric substance group 14a, that is, an upper part surface layer of the laminated piezoelectric substance group 14b to which layer a point of feeding to the main electrode IE in each layer is drawn out faces downward. As a bonding material, an epoxy resin or a UV bonding agent is used.

Figure 15B:
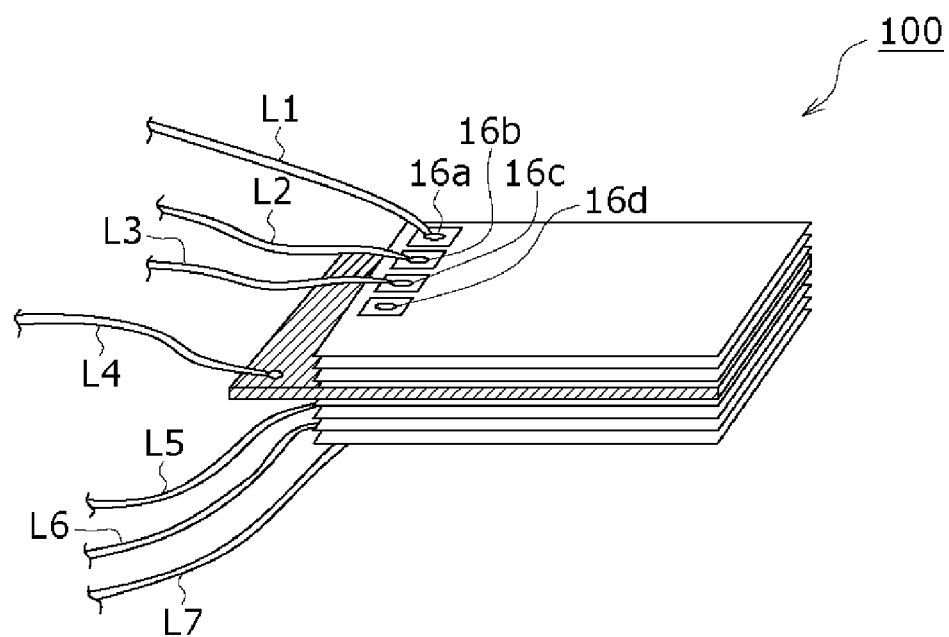
Figure 16A:
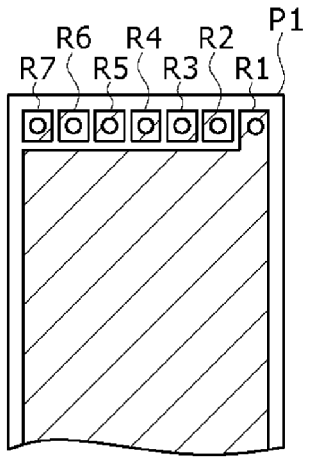
FIGS. 16A, 16B, 16C, 16D, 16E, 16F, and 16G are diagrams showing an example of seven kinds of manufactured electrode patterns P1 to P7.
Figure 16B:
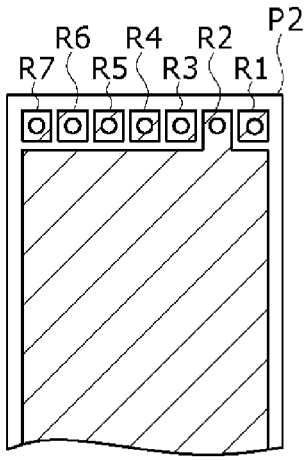
Figure 16C:
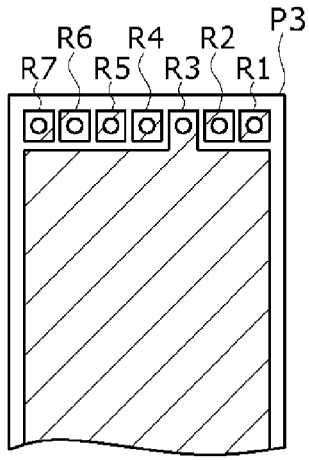
Figure 16D:
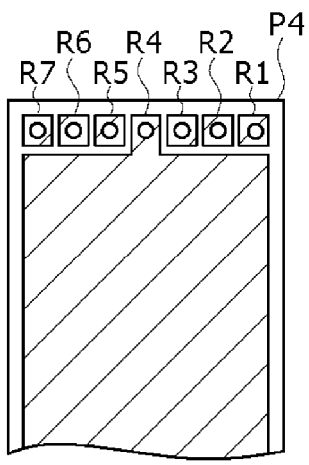
Figure 16E:
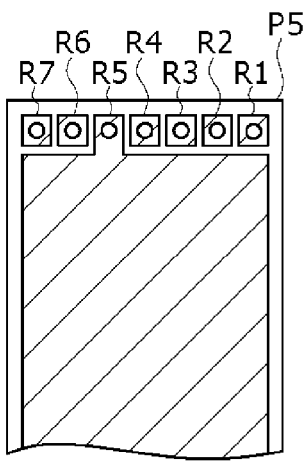
Figure 16F:
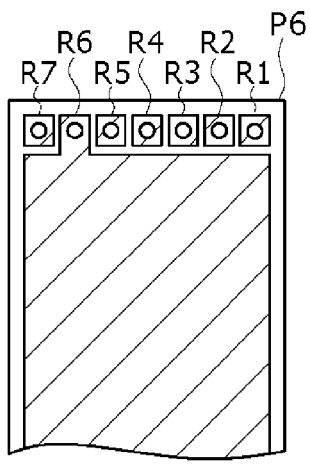
Figure 16G:
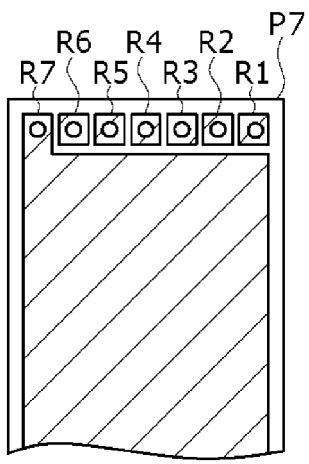

Thereafter, in FIG. 15B, leads L1 to L7 necessary for the multifunction piezoelectric actuator to function as a piezoelectric actuator and a force detecting sensor are soldered to the lead electrodes (lands) provided on the surface. The land R1 of the laminated piezoelectric substance group 14a forms the terminal 16a. The lead L1 is joined to the terminal 16a. The land R2 of the laminated piezoelectric substance group 14a forms the terminal 16b. The lead L2 is joined to the terminal 16*b*. The land R3 of the laminated piezoelectric substance group 14*a* forms the terminal 16*c*. The lead L3 is joined to the terminal 16*c*. The terminal 16*d* is provided to the central electrode 13. The lead L4 is joined to the terminal 16*d*.

The land R3 of the laminated piezoelectric substance group 14*b* forms the terminal 16*e*. The lead L5 is joined to the terminal 16*e*. The land R2 of the laminated piezoelectric substance group 14*b* forms the terminal 16*f*. The lead L6 is joined to the terminal 16*f*. The land R1 of the laminated piezoelectric substance group 14*b* forms the terminal 16*g*. The lead L7 is joined to the terminal 16*g*. Thus, the multifunction piezoelectric actuator 100 as shown in FIG. 15B is completed. Thereafter a process of polarizing the piezoelectric elements is performed as required.

Thus, according to a method of manufacturing the multifunction piezoelectric actuator 100 according to the third embodiment, a laminate having the upper part surface electrode 11, the lower part surface electrode 12, the central electrode 13, and the 16 layers of the electrodes IE1 to IE16 is formed. Then the laminate is divided electrically to demarcate at least three laminated piezoelectric substance groups 14*a*, 14*b*, and 14*c*. The central electrode 13 is drawn out from the piezoelectric substances #9 and #10 situated at a center of the laminated piezoelectric substance group 14*c* after demarcation. Other electrodes IE6 and IE11 are drawn out from the piezoelectric substances #6 and #12 situated in the laminated piezoelectric substance group 14*c* at the center of the laminate.

Therefore the piezoelectric bimorph type actuator and the force detecting sensor can be formed within an identical structure. In addition, a point of feeding to the main electrode IE in each layer can be drawn out to an upper part surface layer and a lower part surface layer. It is thus possible to provide the multifunction actuator 100 of a low voltage driving type that enables the function of the actuator and the function of the force detecting sensor to be used simultaneously. Thereby, as compared with a case where the piezoelectric actuator and the force detecting sensor are provided separately from each other, a mounting space is shared and thus an electronic device can be made more compact.

While in the third embodiment, description has been made of a case where the function of the actuator and the function of the sensor are incorporated in the multifunction piezoelectric actuator 100 from the beginning, the present invention is not limited to this. When a charge accumulating function or the like as another function is incorporated into the laminate, for example, screens that serve to provide seven kinds of electrode patterns P1 to P7 as shown in FIG. 16A to 16G are desirably prepared in advance. Each of seven main electrodes IE of the electrode patterns P1 to P7 shown in FIG. 16A to 16G can be drawn out to the upper part surface layer via lands R1 to R7. In addition, by arbitrarily making a short circuit between the lands R1 to R7, the electrodes can be connected in a programmable manner, and thus multiple functions can be incorporated.

Figure 17A:
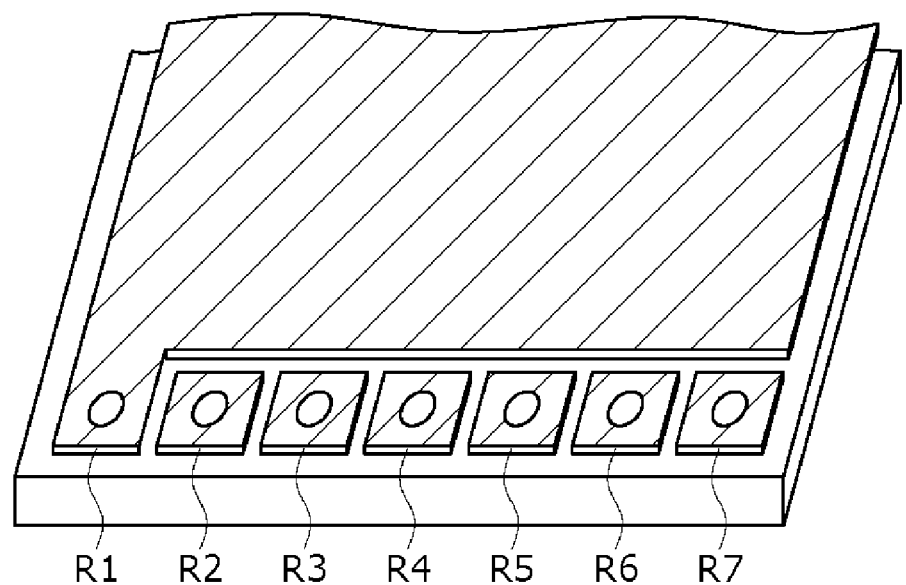
FIGS. 17A and 17B are diagrams of an example of lamination of another film-shaped piezoelectric substance and an example of manufacturing of a through hole part of the film-shaped piezoelectric substance.
Figure 17B:
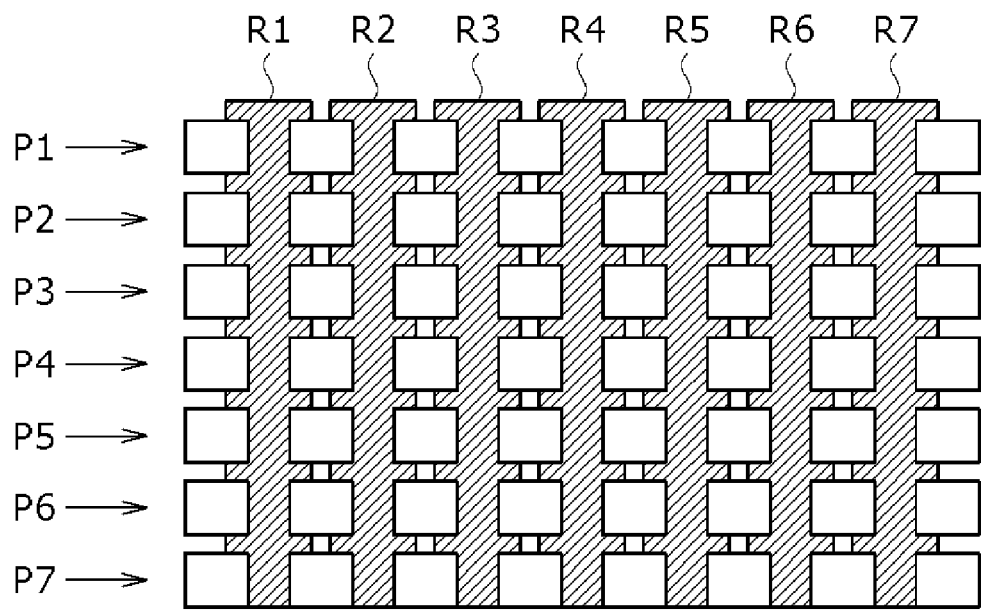

FIG. 17A is a perspective view of an example of lamination of another film-shaped piezoelectric substance. Lands R1 to R7 shown in FIG. 17A are drawn out to an upper part surface layer of an electrode pattern P1. FIG. 17B is a sectional view of an example of formation of a through hole part of the other film-shaped piezoelectric substance. The lands R1 to R7 in each layer are connected by electrode material filled into through holes. This enables all points of feeding to main electrodes IE in seven layers to be drawn out to the upper part surface layer of the electrode pattern P1.

Figure 18B:
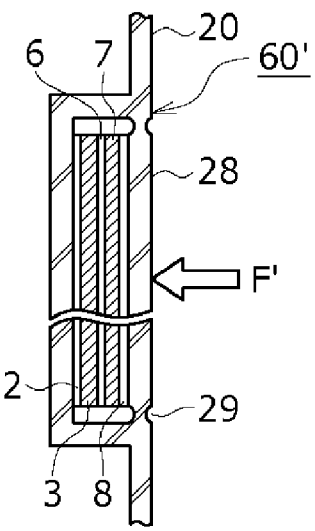
FIGS. 18A and 18B are perspective views of an example of structure of a portable terminal device 200' to which a first input-output device 60' according to a fourth embodiment is applied.
Figure 18A:
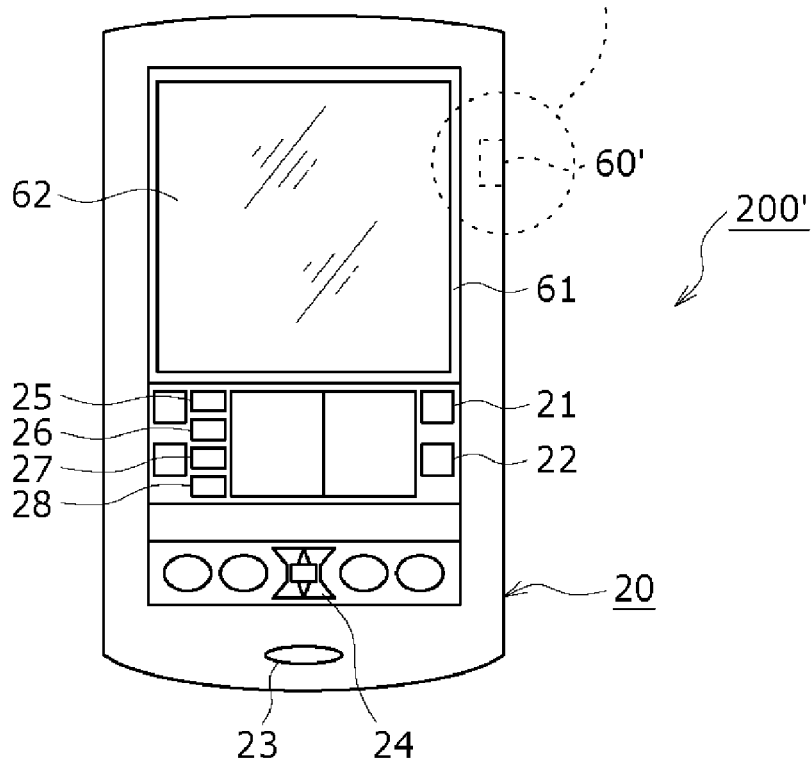

FIGS. 18A and 18B are perspective views of an example of structure of a portable terminal device 200' to which a first input-output device according to a fourth embodiment is applied.

The portable terminal device (PDA) 200' shown in FIG. 18A is an example of an electronic device, and has a first input-output device 60' according to the fourth embodiment of the present invention. The portable terminal device 200' is suitable for application to remote controllers of various electronic devices, electronic dictionaries, portable telephones, digital cameras and the like. The portable terminal device 200' has a main body 20. The main body 20 has a plurality of function keys 21 to 28. In addition to these function keys 21 to 28, the main body 20 has the input-output device 60' with a tactile function.

The input-output device 60' has a multifunction piezoelectric actuator (first piezoelectric composite device) 1 with a touch cover to give vibrational displacements to the touch cover 28. The touch cover 28 is provided so as to cover a detecting electrode. A constricted part 29 is formed at boundaries between the main body 20 and the touch cover 28. The constricted part 29 is formed to provide this part with a diaphragm (spring) effect for easy deformation of the casing. The touch cover 28 is formed by an insulative resin member. Injection integral molding may be performed using a resin member of the main body 20 so as to form the touch cover 28 as a part of the casing. The multifunction piezoelectric actuator 1 is attached to a depression part in a side surface of the main body 20 by bonding or the like, for example. In this example, an actuator function of the multifunction piezoelectric actuator 1 is used to provide a tactile sense to a user, and a sensor function of the multifunction piezoelectric actuator 1 is used as section for inputting switch ON/OFF information from the user.

The multifunction piezoelectric actuator 1 forms tactile sense providing and information determining section. The multifunction piezoelectric actuator 1 operates to provide a tactile sense to a finger 30 of the user pressing the touch cover 28, and also detect an external force applied to the touch cover 28 at a contact position of the finger 30 of the operator and then output a force detection signal (detection voltage Vd). The force detection signal determines switch ON/OFF input information when the touch cover 28 is pressed (first input-output device).

The multifunction piezoelectric actuator 1 has a feeding electrode 2, a common electrode 6, a detecting electrode 8, a piezoelectric element 3 joined between the feeding electrode 2 and the common electrode 6, and a piezoelectric element 7 joined between the common electrode 6 and the detecting electrode 8. In the multifunction piezoelectric actuator 1, a predetermined voltage is supplied between the feeding electrode 2 and the common electrode 6, and a force detection signal based on an external force applied to the touch cover 28 is extracted from the detecting electrode 8 (first piezoelectric composite device). That is, the multifunction piezoelectric actuator 1 forms an example of input section, and operates to detect a touch of the finger 30 of the operator as an example of an operating object and output switch ON information or switch OFF information. For example, when the finger 30 of the operator touches the touch cover 28 and presses the touch cover 28, a pressing force F' is detected, and switch ON information (or switch OFF information) is output.

Figure 19:
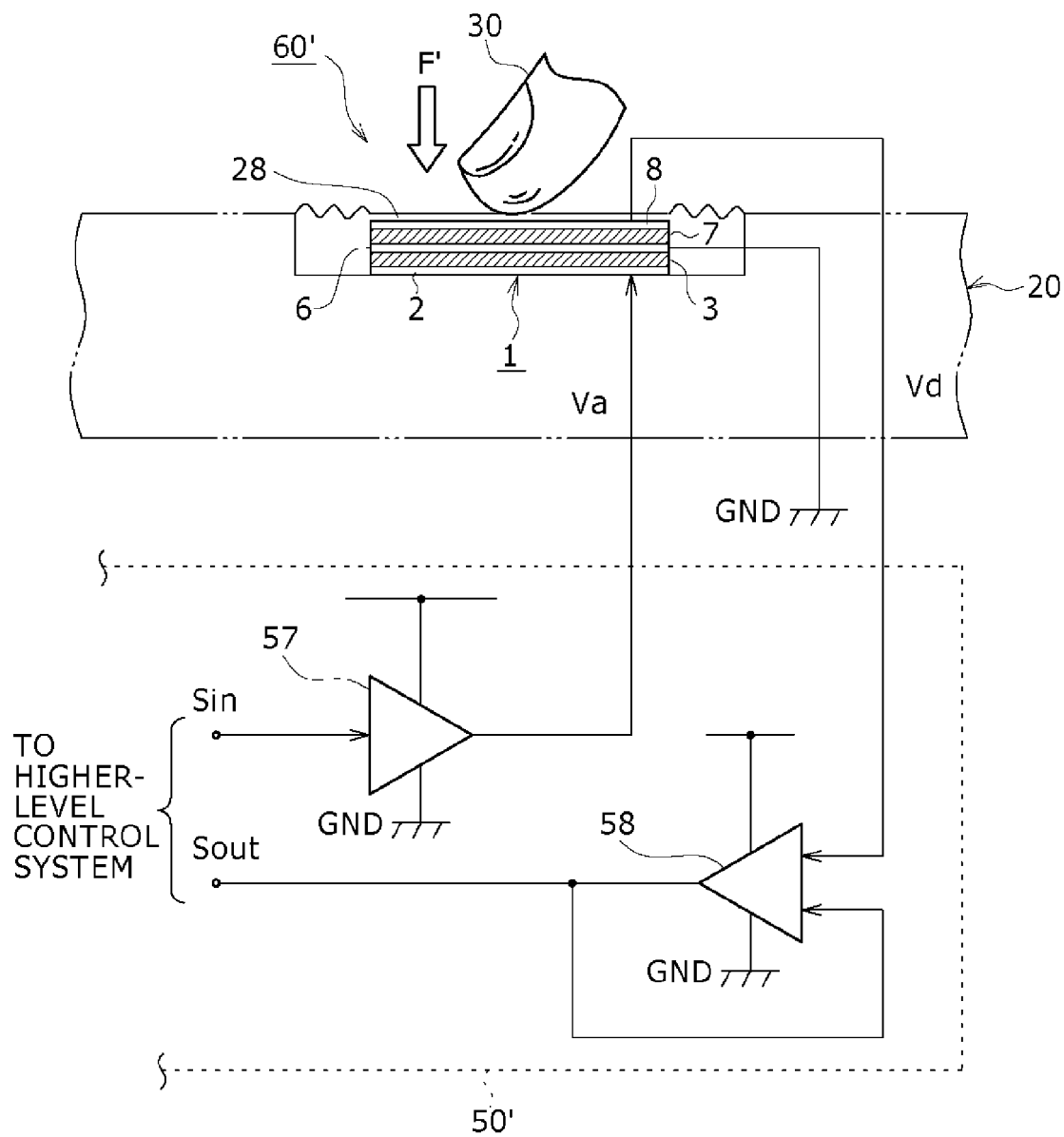
FIG. 19 is a circuit diagram showing an example of configuration of a control system of the input-output device 60'.

FIG. 19 is a circuit diagram showing an example of configuration of a control system of the first input-output device 60'. The first input-output device 60' shown in FIG. 19 includes the multifunction piezoelectric actuator 1, the touch cover 28, and a control device 50'. In the figure, a part shown in a wave shape has a diaphragm. The touch cover 28 covers the entire surface of the detecting electrode 8, and the periphery of the touch cover 28 is engaged with the main body 20 via the diaphragm in such a manner as to be movable vertically.

The control device 50' in this example includes a driver IC 57 such as an amplifier or the like and a comparator 58 such as an operational amplifier or the like. The driver IC 57 is connected to the feeding electrode 2. The driver IC 57 feeds a predetermined voltage Va between the feeding electrode 2 and the common electrode 6 according to a control signal Sin set from a higher-level control system in advance. The comparator 58 is connected to the detecting electrode 8. The comparator 58 detects a force detection signal Sout (detection voltage Vd) from the detecting electrode 8, and then outputs the force detection signal Sout to the higher-level control system. The higher-level control system controls the feeding to the feeding electrode 2 on the basis of the force detection signal Sout obtained from the comparator 58.

The main body 20 shown in FIG. 18A has display section 62. The display section 62 displays input information. The higher-level control system detects a pressing force F' of the finger 30 of the operator selecting an input item displayed by the display section 62, and determines that the input item is selected on the basis of the detected pressing force F' of the finger 30 of the operator. The higher-level control system determines that the input item is selected on the basis of the force detection signal obtained from the detecting electrode 8 shown in FIG. 19. Then the higher-level control system outputs a control signal Sin to the control device 50'. The control device 50' controls the feeding to the feeding electrode 2 on the basis of the control signal Sin. By controlling the feeding, a tactile stimulus is given to the finger 30 of the operator.

Thus, according to the portable terminal device 200' to which the input-output device 60' according to the fourth embodiment is applied, the multifunction piezoelectric actuator (first piezoelectric composite device) 1 according to an embodiment of the present invention is applied to the tactile sense providing and information determining section. The multifunction piezoelectric actuator 1 has the feeding electrode 2, the common electrode 6, the detecting electrode 8, the piezoelectric element 3 joined between the feeding electrode 2 and the common electrode 6, and the piezoelectric element 7 joined between the common electrode 6 and the detecting electrode 8. With this as a precondition, the first input-output device 60' detects a pressing force F' at a contact position of the finger 30 of the operator, and then outputs switch ON or OFF information. The multifunction piezoelectric actuator 1 provides a tactile sense to the finger 30 of the operator pressing the touch cover 28, and also detects the pressing force F' at the contact position of the finger 30 of the operator and determines the switch ON/OFF information.

Hence, since a part of the piezoelectric composite device functioning as a piezoelectric bimorph type actuator can be used as a force detecting sensor for determining the information, the function of the actuator and the function of the force detecting sensor can be used at the same time. In addition, as compared with a case where the actuator and the force detecting sensor are provided separately from each other, a mounting space is shared and thus the first input-output device 60' and the portable terminal device 200' can be made more compact.

Figure 20:
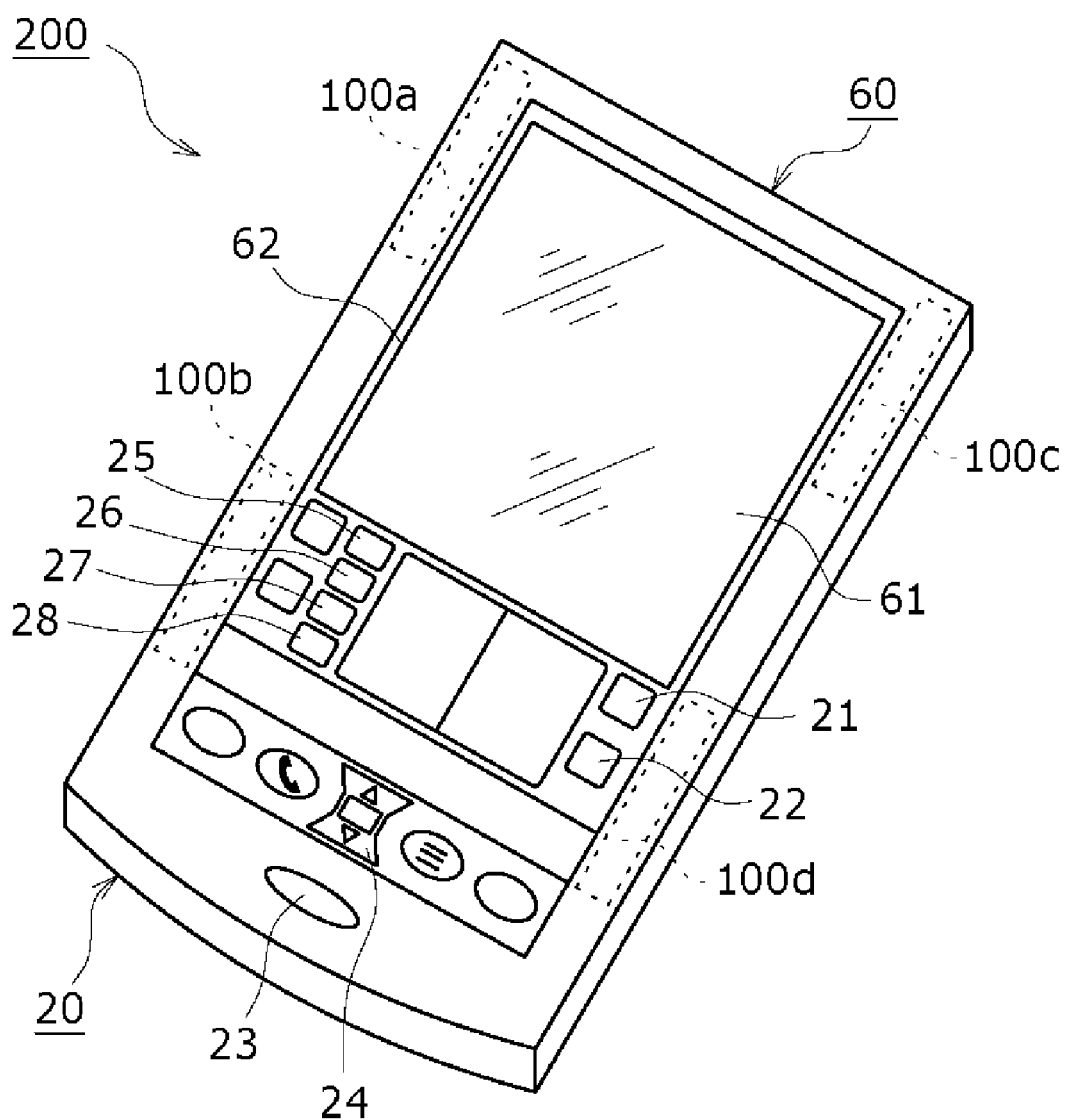
FIG. 20 is a perspective view of an example of structure of a portable terminal device 200 to which a second input-output device 60 according to a fifth embodiment is applied.

FIG. 20 is a perspective view of an example of structure of a portable terminal device 200 to which an input-output device according to a fifth embodiment is applied.

The portable terminal device (PDA) 200 shown in FIG. 20 is an example of an electronic device, and has an input-output device 60 according to the fifth embodiment of the present invention. The portable terminal device 200 is suitable for application to remote controllers of various electronic devices, electronic dictionaries, portable telephones, digital cameras and the like. The portable terminal device 200 has a main body 20. The main body 20 has a plurality of function keys 21 to 28. In addition to these function keys 21 to 28, the main body 20 has the input-output device 60 enabling a touch typing system.

The input-output device 60 has a touch panel 61, display section 62, four multifunction piezoelectric actuators 100*a* to 100*d*, and the like to give vibrational displacements to the touch panel 61. The touch panel 61 forms an example of input section, and operates to detect a contact position of a finger 30 of an operator as an example of an operating object and output input information. For example, when the finger 30 of the operator selects and touches an icon or the like displayed by the display section 62, input information is output.

The display section 62 displays a menu screen and input items such as icon buttons and the like. A liquid crystal display device or an EL (electroluminescence) element is used as the display section 62. The multifunction piezoelectric actuators 100*a* to 100*d* form tactile sense providing and information determining section. The multifunction piezoelectric actuator 1 operates to provide a tactile sense to a finger of the user operating the touch panel 61, and also detect an external force applied to the touch panel 61 at a contact position of the finger 30 of the operator and then output a force detection signal.

The force detection signal determines the input information selected by the touch panel 61. The multifunction piezoelectric actuators 100*a* to 100*d* are applied to the input-output device 60. In this example, an actuator function of the multifunction piezoelectric actuator 100 is used to provide a tactile sense to the user, and a sensor function of the multifunction piezoelectric actuator 100 is used as section for collecting input information from the user (second input-output device).

Figure 21:
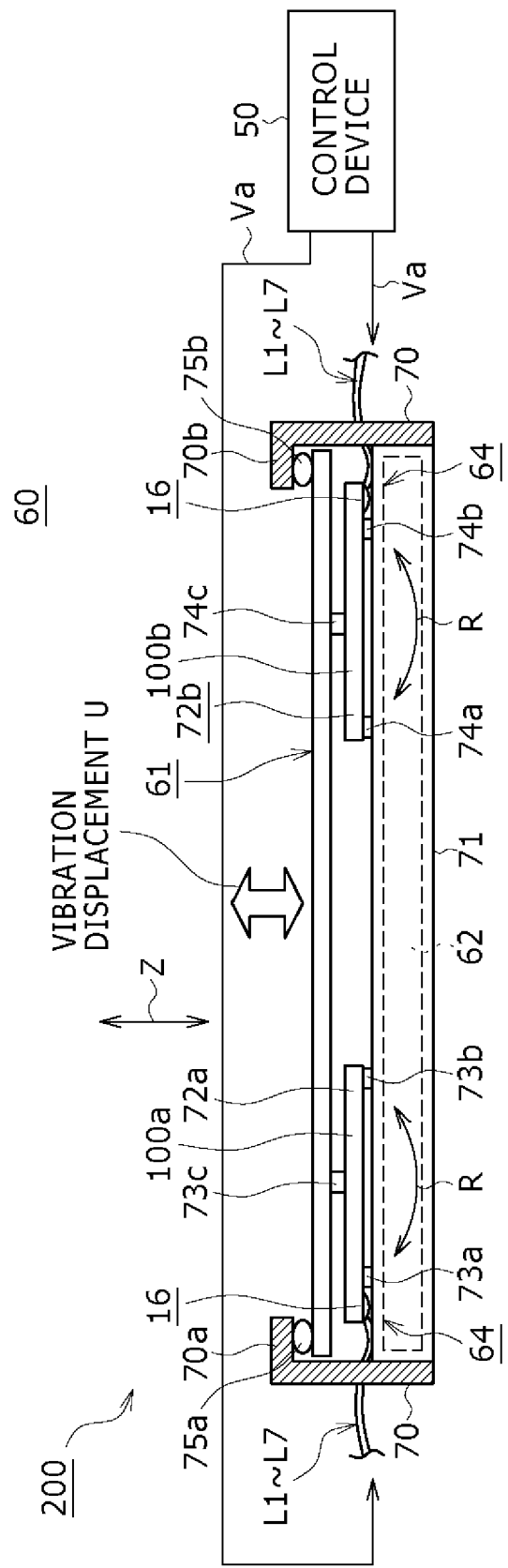
FIG. 21 is a sectional view of an example of structure of the input-output device 60 including a touch panel 61, display section 62, and multifunction piezoelectric actuators 100a and 100b.

FIG. 21 is a sectional view of an example of structure of the input-output device 60 in the portable terminal device 200 according to the fifth embodiment, the input-output device 60 including the touch panel 61, the display section 62, and the multifunction piezoelectric actuators 100*a* and 100*b*. The display section 62 is disposed under the touch panel 61. Input items displayed by the display section 62 are passed through the touch panel 61 to be presented to the user.

The display section 62 is disposed inside a supporting frame 71 such that a display screen is exposed. The multifunction piezoelectric actuators 100*a* and 100*b* and the like are disposed at four corners on the supporting frame 71 (only two corners are shown in FIG. 21). The multifunction piezoelectric actuator 100*a* on a left side is disposed with two supporting parts 73*a* and 73*b* on the supporting frame 71 as a pillow. A supporting part 73*c* is provided to a central part of the actuator 100*a*. The supporting part 73*b* is disposed on a back side of an upper end part 72*a* of the actuator 100*a*. The supporting part 73*a* is disposed at a position adjacent to a terminal 16. The terminal 16 forms the terminals 16*a* to 16*g* shown in FIG. 15B.

The multifunction piezoelectric actuator 100*b* on a right side is disposed with two supporting parts 74*a* and 74*b* on the supporting frame 71 as a pillow. A supporting part 74*c* is provided to a central part of the actuator 100*b*. The supporting part 74*a* is disposed on a back side of an upper end part 72*b* of the actuator 100*b*. The supporting part 74*b* is disposed at a position adjacent to a terminal 16. The terminal 16 forms the terminals 16*a* to 16*g* shown in FIG. 15B.

The touch panel 61 is disposed on the supporting parts 73*c* and 74*c*. The touch panel 61 is fixed to the supporting frame 71 by a side supporting member 70 having an upper part in an inverted L-shape. Seal members 75a and 75b are inserted between the touch panel 61 and upper end parts 70a and 70b of the side supporting member 70. The supporting parts 73a to 73c and the supporting parts 74a to 74c form a vibration transmitting mechanism 64.

The multifunction piezoelectric actuators 100a and 100b are each connected to a control device 50. For example, the terminal 16 of the actuator 100a is connected with the seven leads L1 to L7 shown in FIG. 15B. The leads L1 to L7 are connected to the control device 50. The terminal 16 of the multifunction piezoelectric actuator 100b is connected with the seven leads L1 to L7 shown in FIG. 15B. The leads L1 to L7 are also connected to the control device 50.

The control device 50 applies a command voltage (actuator driving voltage) Va to laminated piezoelectric substance groups 14a and 14b functioning as an actuator in the multifunction piezoelectric actuator 100a via the leads L1 to L7. A bend deformation (R) at this time is converted into a displacement U in a Z-direction of the touch panel 61. For example, when the control device 50 generates the actuator driving voltage Va and supplies the actuator driving voltage Va through the leads L1, L2, L6, and L7 connected to the multifunction piezoelectric actuator 100a to the piezoelectric substances #1 to #5 and the piezoelectric substances #14 to #18 of the laminated piezoelectric substance group 14a and the laminated piezoelectric substance group 14b via the terminals 16a, 16b, 16f, and 16g shown in FIG. 6, the laminated piezoelectric substance group 14a vibrates so as to elongate, and the laminated piezoelectric substance group 14b vibrates so as to contract with the central electrode 13 as a reference. Thus the multifunction piezoelectric actuator 100a can be operated as an actuator.

The control device 50 applies a command voltage Va to laminated piezoelectric substance groups 14a and 14b functioning as an actuator in the multifunction piezoelectric actuator 100b via the leads L1 to L7. A bend deformation (R) at this time is converted into a displacement U in a Z-direction of the touch panel 61. For example, when the control device 50 generates the actuator driving voltage Va and supplies the actuator driving voltage Va through the leads L1, L2, L6, and L7 connected to the multifunction piezoelectric actuator 100b to the piezoelectric substances #1 to #5 and the piezoelectric substances #14 to #18 of the laminated piezoelectric substance group 14a and the laminated piezoelectric substance group 14b via the terminals 16a, 16b, 16f, and 16g shown in FIG. 6, the laminated piezoelectric substance group 14a vibrates so as to elongate, and the laminated piezoelectric substance group 14b vibrates so as to contract with the central electrode 13 as a reference. Thus the multifunction piezoelectric actuator 100b can be operated as an actuator.

Figure 22A:
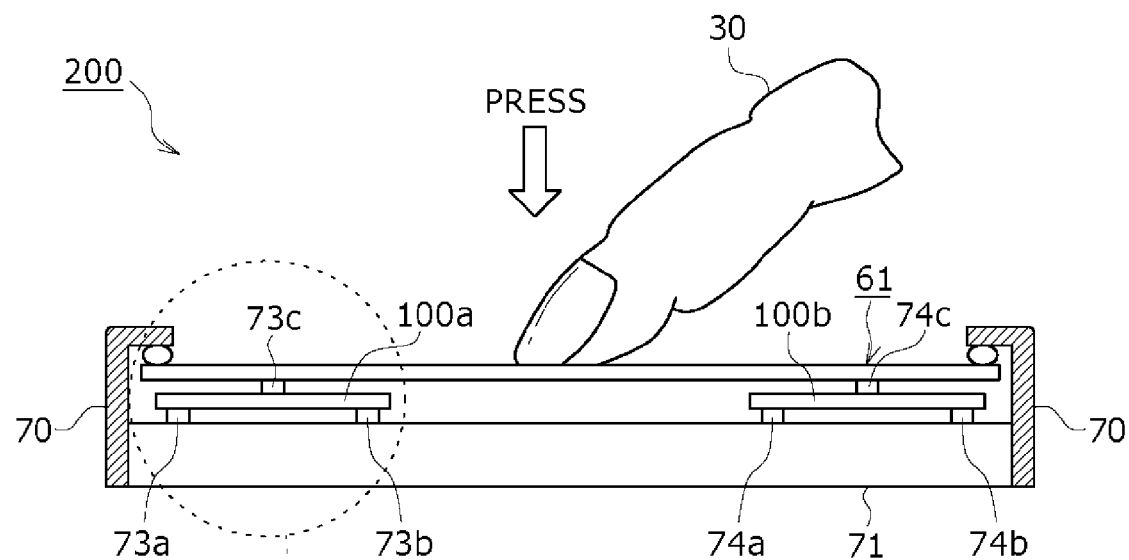
FIGS. 22A and 22B are sectional views of an example of operation when the touch panel in the input-output device 60 is pressed.
Figure 22B:
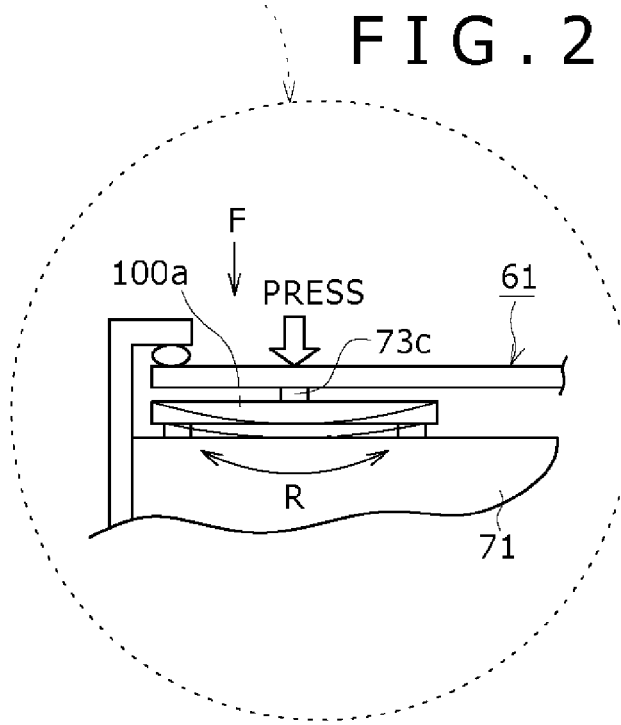

FIGS. 22A and 22B are sectional views of an example of operation when the touch panel in the input-output device 60 is pressed. The supporting part 73c shown in FIG. 22A forms a supporting point when the finger 30 of the user presses the touch panel 61 and the pressing force F causes a bend deformation (R) of the multifunction piezoelectric actuator 100 as shown in FIG. 22B in a broken line circle. In the multifunction piezoelectric actuator 100a and the like, a laminated piezoelectric substance group 14c functioning as a sensor as shown in FIG. 6 generates a force detection voltage Vd (voltage signal).

For example, when an external force is applied to the piezoelectric substances #7 to #12 of the laminated piezoelectric substance group 14c, a force detection voltage Vd occurs in the lead L3 and the lead L5. The force detection voltage Vd is output to the control device 50. The control device 50 for example detects the force detection voltage Vd, and outputs the force detection voltage Vd as a force detection signal Sout to a higher-level control system. Thus the multifunction piezoelectric actuator 100 can also be operated as a force detecting sensor while the actuator function of the multifunction piezoelectric actuator 100 is retained (see FIG. 6).

Figure 23:
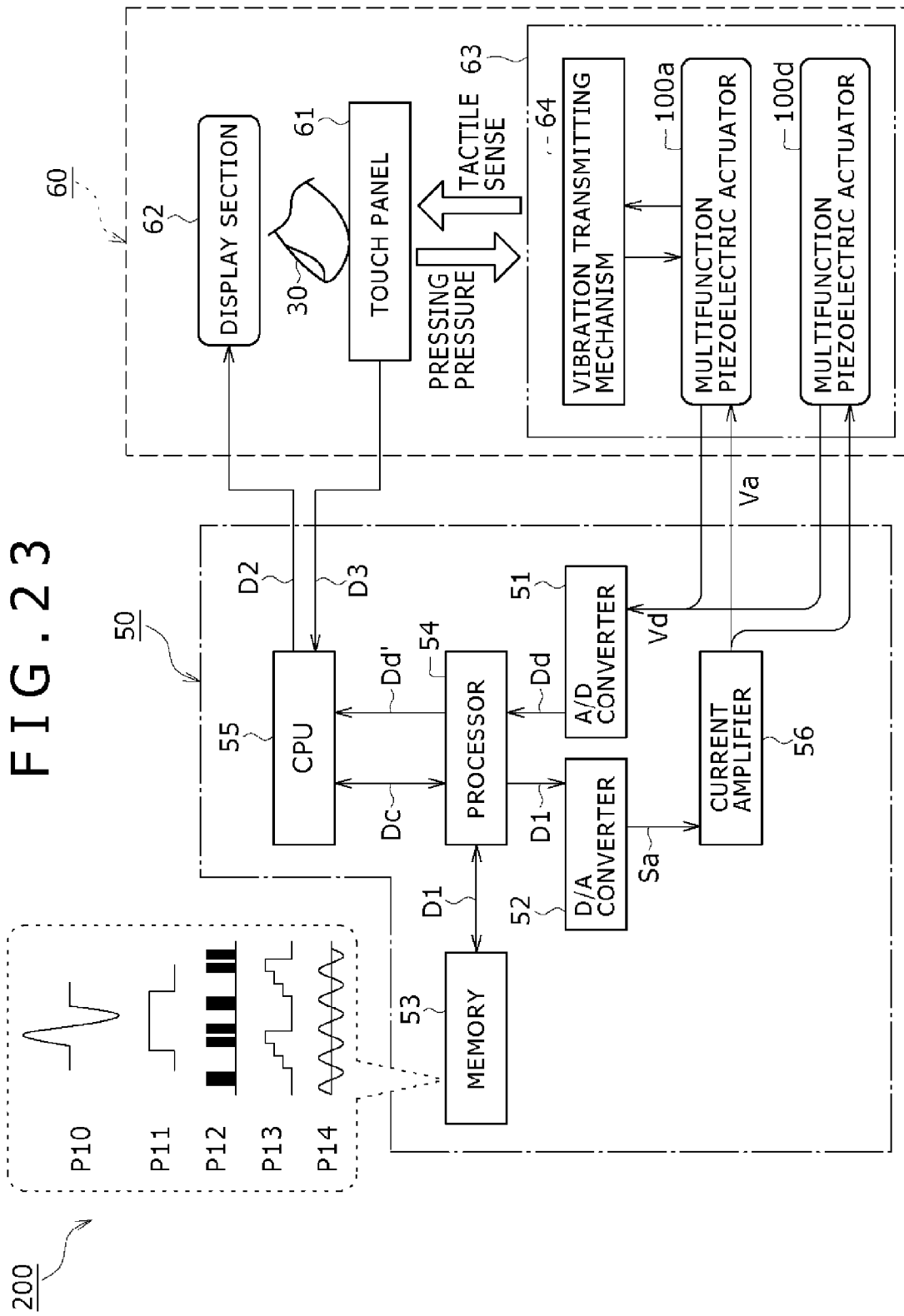
FIG. 23 is a block diagram showing an example of configuration of main parts of the portable terminal device 200.

FIG. 23 is a block diagram showing an example of configuration of main parts of the portable terminal device 200. The portable terminal device 200 shown in FIG. 23 has the control device 50 and the input-output device 60. The control device 50 for example includes an analog-to-digital (hereinafter referred to as A/D) converter 51, a digital-to-analog (hereinafter referred to as D/A) converter 52, a memory 53, a processor 54, a CPU 55, and a current amplifier 56.

The input-output device 60 includes the touch panel 61, the display section 62, and vibration generating section 63. When a menu screen or an input item such as an icon button or the like is pressed, the touch panel 61 for example outputs operation data D3 constituting coordinate input position information to the CPU 55. The display section 62 displays the menu screen or the input item such as the icon button or the like on the basis of display data D2 output from the CPU 55.

The input-output device 60 in this example has the vibration generating section 63. The vibration generating section 63 has the four multifunction piezoelectric actuators 100a to 100d, the vibration transmitting mechanism 64 shown in FIG. 21, and the like. The multifunction piezoelectric actuators 100a to 100d and the like are connected to the control device 50. The control device 50 controls feeding to the main electrodes IE of the laminated piezoelectric substance groups 14a and 14b on the basis of a force detection voltage Vd obtained from the central electrode 13 of the laminated piezoelectric substance group 14c shown in FIG. 6 in the multifunction piezoelectric actuators 100a to 100d.

The multifunction piezoelectric actuators 100a to 100d are connected with the A/D converter 51. The A/D converter 51 subjects the force detection voltage Vd to A/D conversion, and then outputs digital force detection data Dd. The processor 54 is connected to the A/D converter 51. The processor 54 operates so as to assist the CPU 55 in operations and control. For example, the processor 54 is supplied with the force detection data Dd from the A/D converter 51, determines a vibration waveform pattern on the basis of the force detection data Dd, and then supplies pattern determining data Dd' to the CPU 55. A digital signal processor (hereinafter referred to as a DSP) is used as the processor 54.

The processor 54 is connected to the memory 53. The memory 53 stores various vibration waveform pattern data D1. The memory 53 for example stores an acknowledgment waveform pattern P10 indicating reception of an operation, and vibration control waveform patterns P11, P12, P13, and P14 providing various tactile waveforms. The vibration control waveform pattern P11 is a so-called rectangular wave pattern generating a click sense, or for example a sense of stiffness. The vibration control waveform pattern P12 is a digital waveform pattern that provides a rhythmic feeling as of a heart beat. The vibration control waveform pattern P13 is a waveform pattern providing a sense of an operation that generates continuous movements. The vibration control waveform pattern P14 is a pattern providing a reaction of an ordinary touch panel surface, that is, a substantially constant vibrational displacement.

The processor 54 is connected to the CPU 55 as well as the memory 53. The CPU 55 determines a vibration waveform pattern to be read on the basis of the operation data D3 and the pattern determining data Dd'. The CPU 55 outputs a pattern reading allowing instruction Dc to the processor 54. The processor 54 reads the vibration waveform pattern data D1 from the memory 53 on the basis of the pattern reading allowing instruction Dc, and then sets the vibration waveform pattern data D1 in the D/A converter 52.

The processor 54 is connected to the D/A converter 52. The D/A converter 52 subjects the vibration waveform pattern data D1 read out by the processor 54 to D/A conversion, and then outputs an analog vibration control signal Sa to the current amplifier 56. The current amplifier 56 generates an actuator driving voltage (command voltage) Va on the basis of the vibration control signal Sa. The driving voltage Va is supplied to the laminated piezoelectric substance groups 14a and 14b functioning as actuator in the multifunction piezoelectric actuators 100a to 100d. Incidentally, the processor 54, the D/A converter 52, and the current amplifier 56 form the actuator control section 15 shown in FIGS. 7A and 7B.

Thus, the processor 54 detects a force F of the finger 30 of the user selecting an input item displayed by the display section 62, and the CPU 55 determines that the input item is selected on the basis of the force of the finger 30 of the user which force is detected by the processor 54. For example, the CPU 55 determines that the input item is selected on the basis of the force detection voltage Vd obtained from the central electrode 13 of the laminated piezoelectric substance group 14c via the processor 54, and then controls feeding to the main electrodes IE of the laminated piezoelectric substance groups 14a and 14b via the processor 54 to thereby give a tactile stimulus to the finger 30 of the user (acknowledging method using a tactile sense).

Figure 24:
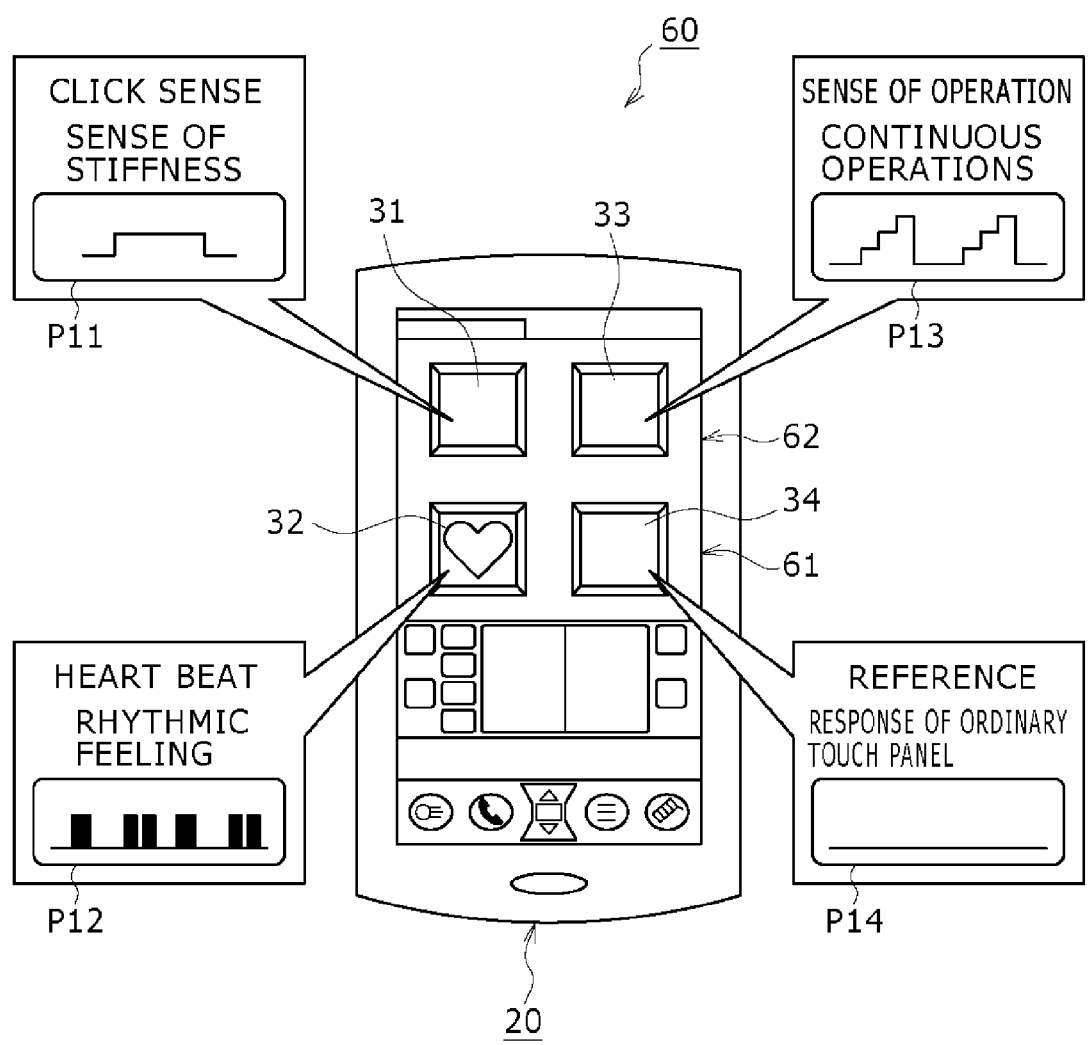
FIG. 24 is a diagram representing an example of operation of the portable terminal device 200.

An example of control of the portable terminal device 200 will next be described. FIG. 24 is a diagram representing an example of operation of the portable terminal device 200. In this example, description will be made of three cases, that is, a case where the multifunction piezoelectric actuators 100a to 100d and the like within the input-output device 60 are made to function as actuator, a case where the multifunction piezoelectric actuators 100a to 100d and the like are made to function as force detecting sensor, and a case where the multifunction piezoelectric actuators 100a to 100d and the like are made to perform a series of operations.

[Actuator Function]

The display section 62 shown in FIG. 24 displays a menu screen. In this example, four icons 31 to 34 are displayed on the menu screen. Suppose that the user selects one of the four icons 31 to 34.

When the finger 30 of the user touches the icon 31, 32, 33, or 34 displayed on the menu screen via the touch panel 61 in FIG. 24, coordinate position information on a position where the finger 30 of the user touches the icon 31, 32, 33, or 34 is output as operation data D3 to the CPU 55. The CPU 55 specifies the vibration control waveform pattern P11 corresponding to the icon that the finger 30 of the user touches, for example the icon 31. The CPU 55 controls the processor 54 to read the vibration control waveform pattern P11 corresponding to the icon 31 from the memory 53.

The processor 54 reads the vibration waveform pattern data D1 for providing the vibration control waveform pattern P11 from the memory 53, and then sets the vibration waveform pattern data D1 in the D/A converter 52. The D/A converter 52 subjects the vibration waveform pattern data D1 read out by the processor 54 to D/A conversion, and then outputs an analog vibration control signal Sa to the current amplifier 56. The current amplifier 56 generates an actuator driving voltage (command voltage) Va on the basis of the vibration control signal Sa. The driving voltage Va is supplied to the laminated piezoelectric substance groups 14a and 14b functioning as actuator in the multifunction piezoelectric actuators 100a to 100d. Thereby a vibration providing a click sense corresponding to the icon 31 is generated on the touch panel surface to be provided as a tactile stimulus to the finger 30 of the user.

When the icon 32 is touched, a vibration providing a rhythmic feeling as of a heart beat, which vibration is based on the vibration control waveform pattern P12, is generated on the touch panel surface to be provided as a tactile stimulus to the finger 30 of the user. When the icon 33 is touched, a vibration providing a sense of an operation that generates continuous movements, which vibration is based on the vibration control waveform pattern P13, is generated on the touch panel surface to be provided as a tactile stimulus to the finger 30 of the user. When the icon 34 is touched, only reaction of an ordinary touch panel surface, that is, a substantially constant vibrational displacement, based on the vibration control waveform pattern P14, is generated on the touch panel surface to be provided as a tactile stimulus to the finger 30 of the user.

When the user puts the finger out of contact with the touch panel surface or when the user slides the finger on the touch panel surface to a position outside an area where the icon 31 or the like is displayed, the CPU 55 determines at all times whether the icon is touched on the basis of coordinate position information output from the touch panel 61 to the CPU 55, and then resets the command voltage Va for the multifunction piezoelectric actuators 100a to 100d. This reset operation stops the vibration of the touch panel surface. Thus, the user knows which of the icon 31, 32, 33, and 34 the user is selecting by touching the touch panel surface without seeing the icon 31, 32, 33, or 34 with his/her eyes. Thus, the multifunction piezoelectric actuators 100a to 100d and the like can be operated as actuator.

[Function of Force Detecting Sensor]

When the finger of the user touches the touch panel in FIG. 24, a pressing force F applied to the touch panel 61 deforms the multifunction piezoelectric actuators 100a to 100d, so that a force detection voltage Vd occurs in the laminated piezoelectric substance group 14c functioning as force detecting sensor (see FIGS. 22A and 22B). When the user knows by the above-described method that the finger 30 of the user is on an icon that the user desires to select, the user for example presses in the touch panel 61 more strongly to select the icon 31 or the like. This operation of pressing in the touch panel 61 causes a higher force detection voltage Vd in the laminated piezoelectric substance group 14c functioning as force detecting sensor.

The force detection voltage Vd is output to the A/D converter 51. The A/D converter 51 subjects the force detection voltage Vd to A/D conversion, and then outputs digital force detection data Dd. The force detection data Dd is output from the A/D converter 51 to the processor 54. The processor 54 is supplied with the force detection data Dd from the A/D converter 51, and compares a level to be compared which level is based on the force detection data Dd with a preset threshold level at any time.

When the level to be compared which level is based on the force detection data Dd exceeds the threshold level, the CPU 55 determines that the user is selecting (pressing) (has selected (pressed)) the icon 31 or the like. When the level to be compared does not exceed the threshold level, the CPU 55 determines that the user is searching for the icon 31 or the like. Thereby the multifunction piezoelectric actuators 100a to 100d and the like can be operated also as force detecting sensor.

[Example of Series of Operations of Actuator and Force Detecting Sensor]

Figure 25A:
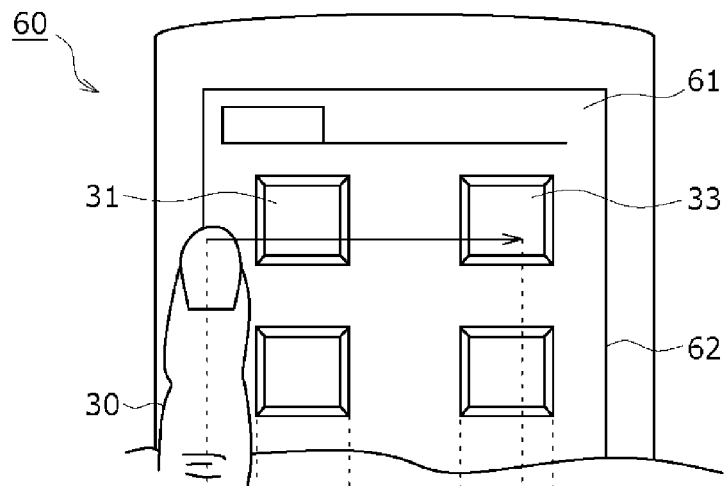
FIGS. 25A, 25B, and 25C are diagrams representing an example of a series of operations and an example of waveforms in the input-output device 60.
Figure 25B:
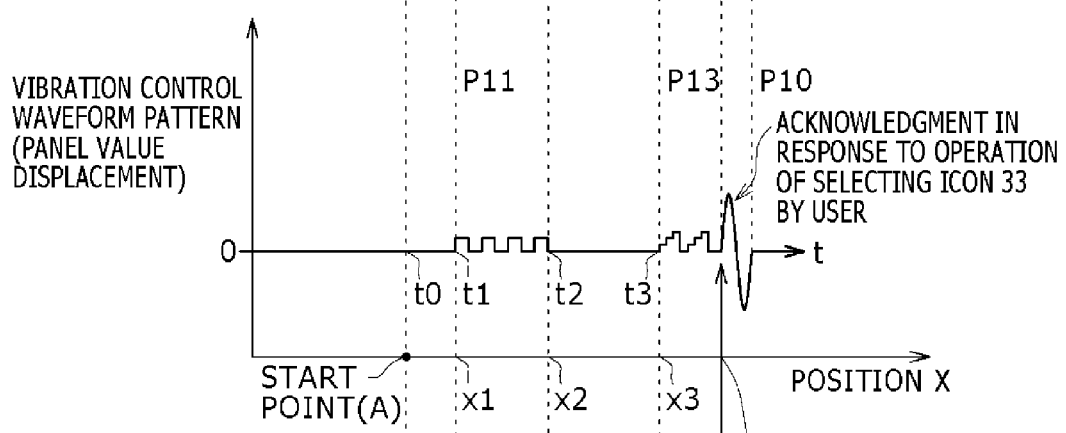
Figure 25C:
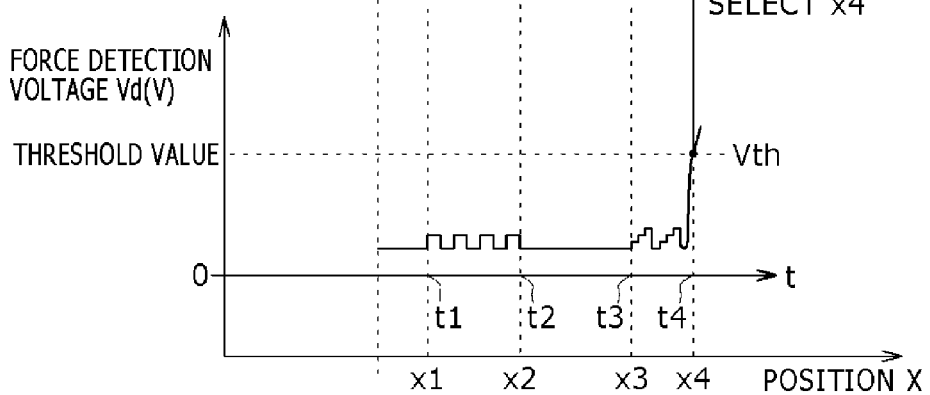
Figure 26:
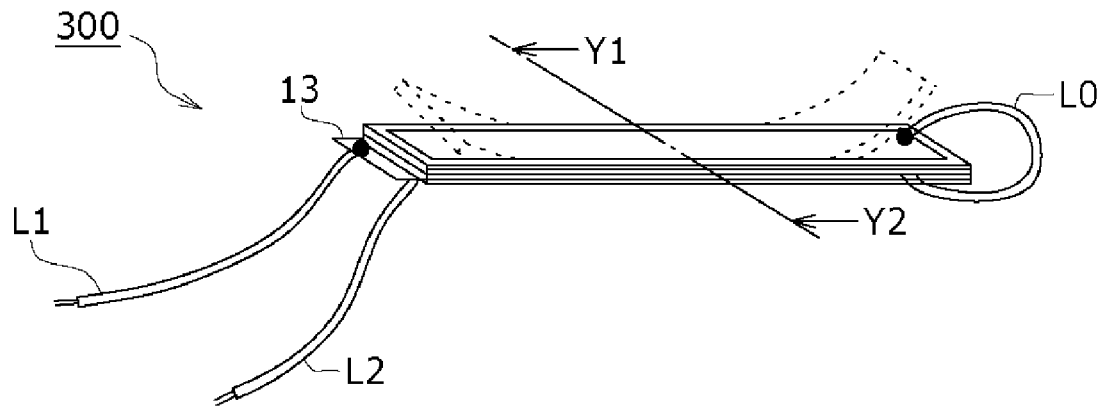
FIG. 26 is a perspective view of an example of structure of a multilayer piezoelectric bimorph type actuator 300 according to a conventional example.
Figure 27:
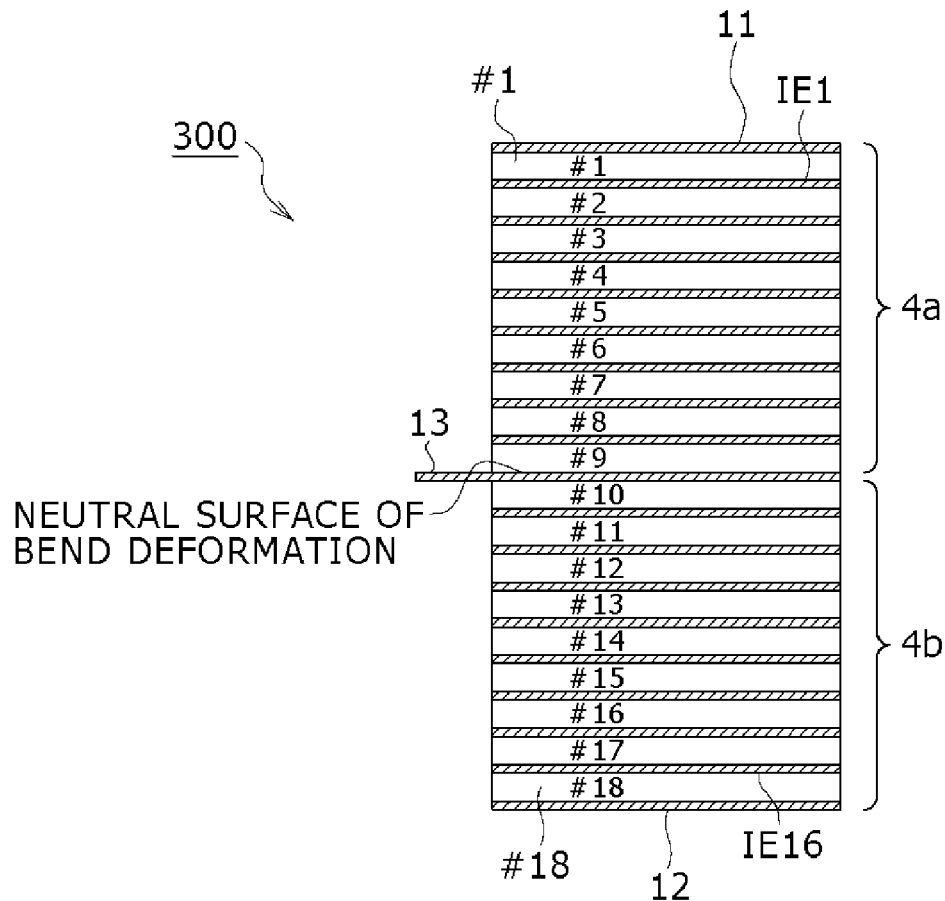
FIG. 27 is a sectional view showing an example of a laminated structure of the multilayer piezoelectric bimorph type actuator 300.

FIGS. 25A to 25C are diagrams representing an example of a series of operations and an example of waveforms in the input-output device 60. In FIGS. 25B and 25C, an axis of abscissas represents time t and the contact position X of the finger 30. An axis of ordinates represents a combined value [V] of the actuator driving voltage Va based on the vibration control waveform pattern P10 to P13 and the force detection voltage Vd.

In the fifth embodiment, a case in which the user searches for the icon 33 while sliding the finger 30 from a left side to a right side on the icon 31, and selects the icon 33 will be taken as an example. A series of operations of the multifunction piezoelectric actuators 100*a* to 100*d* in this case will be described using the function of the actuator based on the specific vibration control waveform patterns P10 to P13 and the force detection voltage Vd detected by the function of the force detecting sensor.

In FIG. 25A, the user slides the finger 30 of the user in a direction of a right arrow from a position (A) in the figure, that is, a start point (A) at a left end part of the icon 31 to find the desired icon 33. The user performs a selecting operation at a time when (at a position where) the finger 30 reaches the desired icon 33.

With these operating conditions, the user does not touch either of the icons 31 and 33 at the start point (A), that is, at a time t0, and therefore level of the actuator driving voltage Va shown in FIG. 25B is zero. While the touch panel surface shows displacements in proportion to the actuator driving voltage Va based on the vibration control waveform pattern P11 or the like, no vibration occurs with the actuator driving voltage Va having a zero level at this time. In this case, the user does not feel anything. As for the force detection voltage Vd, on the other hand, since the user touches the finger 30 to the touch panel surface only lightly, a corresponding force detection voltage Vd appears. The force detection voltage Vd at this time is lower than a threshold value, as shown in FIG. 25C.

Next, when the user slides the finger 30 and the finger 30 reaches the icon 31 at a position x1 at a time t1, the processor 54 reads the vibration control waveform pattern P11 defined in advance from the memory 53, and then sets the vibration control waveform pattern P11 in the D/A converter 52. The D/A converter 52 subjects the vibration waveform pattern data D1 read out by the processor 54 to D/A conversion, and then outputs an analog vibration control signal Sa to the current amplifier 56. The current amplifier 56 generates an actuator driving voltage (command voltage) Va on the basis of the vibration control signal Sa. The driving voltage Va is supplied to the laminated piezoelectric substance groups 14*a* and 14*b* functioning as actuator in the multifunction piezoelectric actuators 100*a* to 100*d*. Thereby a vibration providing a click sense corresponding to the icon 31 is generated on the touch panel surface to be provided as a tactile stimulus to the finger 30 of the user.

The force detection voltage Vd at this time is a result of superimposing the actuator driving voltage Va for deforming the multifunction piezoelectric actuators 100*a* to 100*d* and the like on the basis of the vibration control waveform pattern P11 on the force detection voltage resulting from the user touching the touch panel 61. The force detection voltage Vd is converted into force detection data Dd.

Further, when the user moves the finger 30 to the right side, the finger 30 goes away from the icon 31 at a position x2 at a time t2, and therefore the same state as at the start point (A) reappears. When the finger 30 goes onto the icon 33 at a position x3 at a time t3, the vibration control waveform pattern P13 corresponding to the icon 33 is set (output) from the memory 53 to the D/A converter 52. The D/A converter 52 subjects the vibration waveform pattern data D1 read by the processor 54 to D/A conversion, and then outputs an analog vibration control signal Sa to the current amplifier 56.

The current amplifier 56 generates an actuator driving voltage (command voltage) Va on the basis of the vibration control signal Sa. The driving voltage Va is supplied to the laminated piezoelectric substance groups 14*a* and 14*b* functioning as actuator in the multifunction piezoelectric actuators 100*a* to 100*d*. Thereby a vibration providing a sense of an operation that generates continuous movements, which vibration is based on the vibration control waveform pattern P13, is generated on the touch panel surface to be provided as a tactile stimulus to the finger 30 of the user.

The user presses the touch panel surface at a position x4 at a time t4 to select the icon 33. Then, the value of the force detection voltage Vd is increased in proportion to a pressing force F. When the value of the force detection voltage Vd exceeds the preset threshold value Vth shown in FIG. 25C, the CPU 55 determines that selection is made by the user. Making this determination, the CPU 55 reads, from the memory 53, the acknowledgment waveform pattern P10 indicating that an operation by the user is received, and then outputs the acknowledgment waveform pattern P10 to the D/A converter 52. Thus, a vibration with a sharp rising edge is generated on the basis of the acknowledgment waveform pattern P10 so that the user can be informed (confirm) that the selection by the user is received by the CPU 55.

Thus, the input-output device 60 according to an embodiment of the present invention is applied to the portable terminal device 200 according to the fifth embodiment, and the multifunction piezoelectric actuators 100*a* to 100*d* according to an embodiment of the present invention are applied to the input-output device 60. The multifunction piezoelectric actuators 100*a* to 100*d* detect a force F at the contact or pressing position of the finger 30 of the user and input acknowledgement information, and also provide a tactile sense to the finger 30 of the user operating the touch panel 61.

Hence, since a part of the multifunction piezoelectric actuator 100 functioning as a piezoelectric bimorph type actuator can be used as a force detecting sensor, the function of the actuator and the function of the force detecting sensor can be used at the same time. In addition, when the function of the force detecting sensor is applied to closed loop control, since the force detecting sensor and the actuator are mechanically within an identical structure but electrically independent of each other, optimum control can be realized.

Furthermore, as compared with a case where an actuator itself is used as a force detecting sensor as in a system in the past, since the command voltage Va to the actuator and the force detection voltage Vd from the force detecting sensor do not need to be electrically separated from each other, an actuator control circuit can be formed simply and inexpensively. Thus, as compared with a case where the actuator and the force detecting sensor are provided separately from each other, a mounting space is shared and therefore the input-output device 60 and the portable terminal device 200 can be reduced in size and cost.

When the function of the force detecting sensor is used to detect a force F of the user operating the portable terminal device 200, for example, the transmission of information (a type of menu, button or the like) by a tactile sense to the user and an input process for receiving a selection on a menu screen of an icon or the like by the user can be realized by the multifunction piezoelectric actuator within an identical structure.

Incidentally, the operation of the user who determines a type of an icon button or the like only by touching the touch panel 61 and selects an appropriate button or the like is a so-called "touch typing operation" in which the user does not need to look at the display screen. When the portable terminal device 200 is mounted in a vehicle, in particular, this contributes to safety of the user because driving operation is not visually hindered.

In addition, when the "touch typing operation" is applied to not only devices mounted in vehicles but also operating remote controllers of large television sets and the like operation of which has become complicated due to recent increase in the number of broadcasting and video distribution channels, it is possible to perform a complicated operation by hand while fixing eyes on a main setting screen. Therefore operability of the input-output device 60 and the portable terminal device 200 is improved.

The present invention is very suitable for application to portable telephones, digital cameras, portable terminals, remote controllers and the like having a tactile input function.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
   an input-output device, including:
      input means for detecting a contact position of an operating object and outputting input information; and
      tactile sense providing and information determining means for providing a tactile sense to said operating object operating said input means, and detecting a physical pressing force at the contact position of said operating object and determining said input information;
   wherein said tactile sense providing and information determining means of said input-output device includes a piezoelectric composite device; and
   wherein said piezoelectric composite device includes:
      a first laminate and a second laminate each having a lead electrode and formed by laminating one or more piezoelectric elements, and
      a third laminate having another lead electrode and having one or more piezoelectric elements laminated between said first laminate and said second laminate,
   wherein when power is supplied to the lead electrodes of said first laminate and said second laminate, the piezoelectric elements of said first laminate and said second laminate vibrate, and
   wherein when the physical pressing force is applied to said third laminate from the operating object applying the physical pressing force from external to the first laminate or the second laminate, the one or more piezoelectric elements of said third laminate output a physical pressing force detection signal from the lead electrode of said third laminate.

2. The electronic device as claimed in claim 1, further comprising a control device connected to the lead electrode of each of said first laminate, said second laminate, and said third laminate, and
   wherein said control device supplies power to the lead electrode of each of said first laminate and said second laminate according to a preset control signal, and detects a force detection signal from the lead electrode of said third laminate.

3. The electronic device as claimed in claim 2,
   wherein said control device controls feeding to the lead electrodes of said first laminate and said second laminate on a basis of the force detection signal from the lead electrode of said third laminate.

4. The electronic device as claimed in claim 2, further comprising display means for displaying said input information, and
   wherein said control device detects the physical pressing force of the operating object selecting an input item displayed by said display means, and determines that said input item is selected on a basis of the detected force of the operating object.

5. The electronic device as claimed in claim 4,
   wherein said control device determines that said input item is selected on a basis of the force detection signal obtained from the lead electrode of said third laminate, and then gives a tactile stimulus to said operating object by controlling feeding to the lead electrodes of said first laminate and said second laminate.

* * * * *